United States Patent [19]
Dawe

[11] Patent Number: 5,831,461
[45] Date of Patent: Nov. 3, 1998

[54] METHOD & APPARATUS FOR TRACKING CHARACTERISTICS OF A DATA STREAM AND A SYSTEM INCORPORATING THE SAME

[75] Inventor: Piers James Geoffrey Dawe, Sawbridgeworth, United Kingdom

[73] Assignee: NOrthern Telecom LImited, Montreal, Canada

[21] Appl. No.: 847,424

[22] Filed: Apr. 24, 1997

[51] Int. Cl.⁶ ..................................................... H03L 7/06
[52] U.S. Cl. ........................... 327/147; 327/144; 327/146
[58] Field of Search .................................. 327/144, 145, 327/146, 147, 154, 155, 156; 375/375, 376, 371, 373

[56] References Cited

U.S. PATENT DOCUMENTS

| | | | |
|---|---|---|---|
| 3,952,254 | 4/1976 | Kurita et al. | 324/141 |
| 4,930,142 | 5/1990 | Whiting et al. | 375/376 |
| 5,553,104 | 9/1996 | Takashi et al. | 375/376 |

*Primary Examiner*—Toan Tran
*Attorney, Agent, or Firm*—John D. Crane

[57] ABSTRACT

The invention seeks to provide an improved method and apparatus for detecting thresholding errors in a digital signal recovered from a transmitted signal, wherein a derived threshold error signal varies linearly with the threshold error. Extraction of a threshold error signal linearly related to the actual threshold error enables increased speed of reaction of a threshold control circuit.

8 Claims, 20 Drawing Sheets

METHOD & APPARATUS FOR TRACKING CHARACTERISTICS OF A DATA STREAM AND A SYSTEM INCORPORATING THE SAME

FIELD OF THE INVENTION

The present invention relates to a method and apparatus for tracking characteristics of a data stream and a system incorporating the same.

BACKGROUND TO THE INVENTION

Digital communication equipment is used in a wide variety of devices for the transmission of digital information. Such information includes numerical data in computers and digital encodings of voice in telecommunications systems.

In the course of transmission of digital signals from a transmitter to a receiver, the digital signals tend to become degraded. Degradation may involve loss of overall strength of the signal, and loss of definition of the pulse edges: at the time of sending, the pulse edges typically rise and fall sharply with respect to the overall pulse length giving a cleanly defined shape to the pulse whilst, at the receiver, the rate of rise and fall of the pulses tends to decrease resulting in less sharply defined pulses. In order to correct for these degradations, it is common practice to regenerate the original digital signal from the distorted one at the receiving end of a digital communication link. The regenerated signal may then be retransmitted along a further transmission link or be further processed locally.

To regenerate a received signal, typically, the receiver must ensure that the received data signal (the data signal) is processed synchronously relative to a local clock signal (the clock signal). It is also necessary to ensure that the amplitude of the data signal is not sampled near the degraded edges of the received data pulses which would lead to incorrect interpretation of the signal. Not only can the data arrive significantly out of phase with the local clock, but minor variations in the frequency of the clock and of the data mean that the phase difference may vary over time. This means that it is necessary not only to identify the phase difference between clock signal and data signal when the data signal is first detected, but also to monitor the phase difference continually while the data signal is being received.

By continually monitoring the difference in phase between the data and the clock, it is possible to adjust the arrival time of either the data or the clock (or both) in order to keep the phase difference within acceptable limits. One means of achieving this effect is to incorporate a variable-delay buffer in the data path or clock path (or both) and adjust the buffer length by means of a feedback circuit dependent upon the perceived phase difference between the two signals at a later point in the circuit. For example, if the data appears to lag behind the clock, either the delay in the clock signal path may be increased or that in the data signal path may be decreased.

A clock-to-data phase detector is a device which takes as two of its inputs a data signal and a clock signal and generates signals giving information about the phase difference between the data signal and clock signal. A known means of representing the phase difference information is by means of a pair of signals: the first signal (the phase signal) comprises a component which represents the phase difference and a further component which represents the variations in the number of edges occurring in the data; the second signal (the reference signal) represents only the latter variation. Subsequent subtraction of the reference signal from the phase signal gives a signal (the phase difference signal) representing only the difference in phase.

Typical existing clock-to-data phase detectors generate a phase difference signal whose pulse duration varies between 0 and 1 clock periods. A problem with existing clock-to-data phase detectors is that non-linearities in the generated phase difference signal occur when the bit rise and fall intervals of the phase difference signal are large relative to the bit period of said data signal. Pulse rise and fall durations are determined by the silicon components used to output the signal. Pulse durations in excess of 0.5 clock periods typically vary linearly with the phase difference of the received data signal. However, as the duration of pulses in the phase difference signal approaches zero so the proportion of the pulse length affected by the rise and fall intervals increases until the rise and fall intervals dominate. Where the rise and fall intervals dominate, pulse durations in the phase difference signal cease to vary linearly with the phase difference of the received data signal. This problem is serious where the data signal bit rate is high relative to the speed at which the phase detector can operate. At high bit rates, for example 10 Gbit/s, the phase detector speed can be constrained by current silicon fabrication technology limits.

A further problem arises in phase detectors employing bistables, since each bistable device introduces a propagation delay to the signal passing through it and this delay may vary according to ambient temperature and power supply voltage. Differences in the total delay introduced along distinct paths within a detector can give rise to variations in the relative phase of signals arriving at each subsequent component within the detector. It is known [from C. R. Hogge, "A Self Correcting Clock Recovery Circuit", Journal of Lightwave Technology, Vol. LT-3, No. 6, December 1985] to generate a phase difference signal employing circuitry constructed using silicon components, whilst at the same time generating a reference signal by employing a fixed delay introduced by means of a delay line implemented by means of, for example, a fixed length of coaxial cable or printed circuit board track. However such delay lines do not exhibit the same characteristics with respect to temperature and power supply voltage as do the silicon components and this leads to variations in the relative phase between the phase signal and the reference signal.

Whilst it is known to construct a clock-to-clock phase detector which provides a linear phase signal, such a mechanism relies on the regular arrival of pulses in both clock signals. In the case of a clock-to-data phase detector, pulses in the data generally arrive at variable intervals so that such clock-to-clock phase detector methods are not applicable.

Regeneration can be achieved by applying threshholding and limiting to the received signal, followed by retiming. Where the data signal arrives at high frequencies or over long distances, it is conventionally retimed using a clock recovered from the data signal.

Where the data arrives continuously from a single transmitter, the threshold and phase values can vary over time, but such variation is generally, but not always, gradual. In cases where data arrives in bursts however and particularly, but not exclusively, where successive bursts originate from distinct transmitters, the threshold and phase values can vary enormously between bursts. This in addition to the variation over time within each burst.

Where the maximum burst length and frequency deviation within a burst can be limited, it is known [from Wong &

Sitch: "A 10 Gb/s ATM Data Synchronizer", IEEE Journal of Solid State Circuits, Vol. 31 No. 109, October 1996] to construct a data synchroniser to resynchronise the received data with the receiver's clock: data transitions of the incoming signal are compared with clock transitions and an error signal is generated if rising and falling transition edges of the data are either both late or both early with respect to the receiver's clock; the error signal so generated is used to adjust the length of a variable length delay buffer present in the data path or clock signal path, thereby effectively bringing the two signals back into alignment.

Existing systems minimise modification of the data signal by adjusting the receiver's clock signal to match the data instead.

It is also known to construct a re-timing circuit taking as input a data signal to be retimed and a clock signal, and providing as output a retimed copy of the received data signal. This circuit may be constructed, for example, using a single D-type bistable.

OBJECT TO THE INVENTION

The invention seeks to provide an improved method and apparatus for detecting variation in threshold and phase of a digital data signal.

SUMMARY OF THE INVENTION

According to a first aspect of the present invention, a digital signal threshold error detector is provided, comprising: rising/falling edge phase detector circuit means adapted to provide a first and a second phase output signals responsive to receipt of rising and falling edges respectively in a data input signal; and threshold circuit means adapted to provide a threshold difference signal which varies linearly with the threshold error of the data signal in response to receipt of the phase output signals.

Advantageously, extraction of a linearly-related error signal enables increased speed of reaction of a threshold control circuit making use of the present invention. This in turn reduces the likelihood of data errors being introduced in any signal subsequently regenerated from the data signal.

According to another aspect of the present invention a digital signal threshold error detector is provided, wherein the threshold differencing circuit means is adapted to provide threshold difference signal, the moving time average of which varies linearly with the threshold error of the data signal.

According to a further aspect of the present invention a digital signal threshold error detector is provided additionally comprising: phase difference consolidating circuit means adapted to provide a phase difference signal the moving time average of which varies linearly with the phase error of the data signal, in response to receipt of the phase output signals.

According to a further aspect of the present invention a digital signal threshold error detector is provided additionally comprising: phase difference consolidating circuit means adapted to provide a phase difference signal the moving time average of which varies linearly with the phase error of the data signal, in response to receipt of the phase output signals, and wherein the threshold differencing circuit means is adapted to provide threshold difference signal, the moving time average of which varies linearly with the threshold error of the data signal.

According to a further aspect of the present invention a digital signal threshold error detector is provided additionally comprising: phase difference consolidating circuit means adapted to provide a phase difference signal the moving time average of which varies linearly with the phase error of the data signal, in response to receipt of the phase output signals.

According to a further aspect of the present invention a digital signal threshold error detector is provided additionally comprising: amplifier circuit means adapted to provide the data input signal to the rising/falling edge phase detector circuit in response to a second data input signal and the threshold difference signal.

According to a further aspect of the present invention a digital signal threshold error detector is provided additionally comprising: amplifier circuit means adapted to provide the data input signal to the rising/falling edge phase detector circuit in response to a second data input signal and the threshold difference signal; adjustable delay circuit means adapted to adjust the phase difference between the clock signal and the data input signal received by the rising/falling phase detector circuit, in response to receipt of one or more output signals from the rising/falling edge phase detector; retiming circuit means adapted to provide a retimed data signal capable in response to receipt of a clock input signal and the data input signal received by rising/falling edge phase detector.

According to a further aspect of the present invention a digital signal threshold error detector is provided additionally comprising: means for controlling a threshold in response to the threshold difference signal.

According to a still further aspect of the present invention a method for digital signal threshold error detection is provided comprising the steps of: provision of a first and a second phase output signals responsive to receipt of rising and falling edges respectively in a data input signal; and provision of a threshold difference signal which varies linearly with the threshold error of the data signal in response to receipt of the phase output signals.

The invention also provides for a system for the purposes of digital signal processing which comprises one or more instances of apparatus embodying the present invention.

The invention is also directed to a method by which the described apparatus operates and including method steps for carrying out every function of the apparatus.

Preferably the method for digital signal threshold error detection comprises the steps of: provision of a first and a second phase output signals responsive to receipt of rising and falling edges respectively in a data input signal; and provision of a threshold difference signal which varies linearly with the threshold error of the data signal in response to receipt of the phase output signals.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
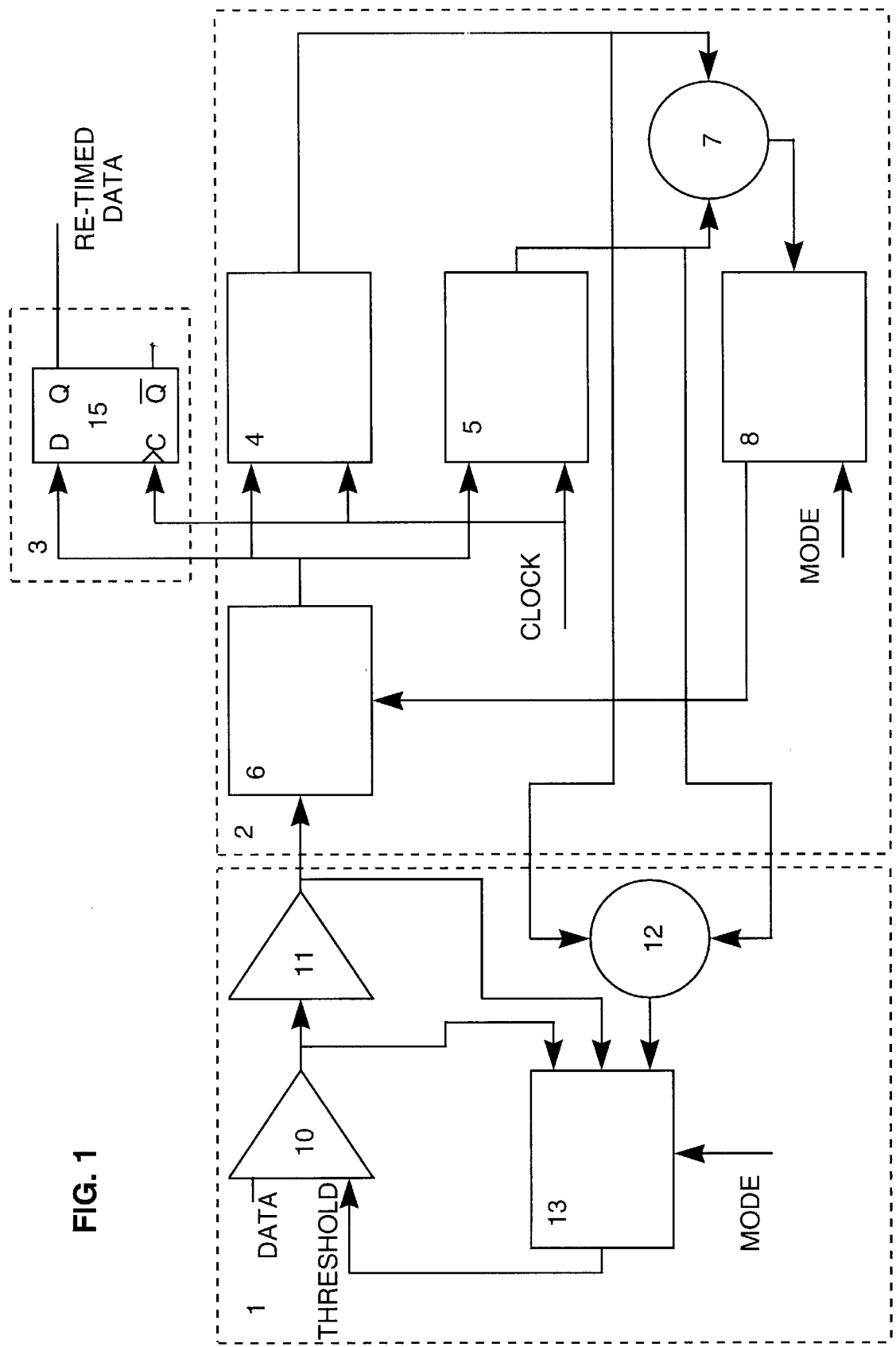
FIG. 1 shows a block diagram of a signal regenerator in accordance with the present invention.

A first embodiment of a signal generator, shown in FIG. 1, comprises a threshold adjustment circuit (1), a phase adjustment circuit (2), and a re-timing circuit (3).

The threshold adjustment circuit (1) takes as inputs a data signal, a mode signal, and two phase signals, and provides as outputs an amplitude-limited data signal.

The phase adjustment circuit (2) receives as inputs the amplitude-limited data signal output from the threshold adjustment circuit (1), a mode signal, and a clock signal, and provides as outputs a first phase signal derived from the rising edges of the amplitude-limited data signal, a second phase signal derived from the falling edges of the amplitude-limited data signal, and a delayed data signal, said phase signals being provided as the phase signals to the threshold adjustment circuit (1).

The re-timing circuit (3) receives as inputs the data signal output from the phase adjustment circuit (2) and a clock signal, and provides as output a retimed data signal.

The threshold adjustment circuit (1) itself comprises two amplifiers (10, 11), a subtractor (12), and a threshold loop filter (13). The first amplifier (10) takes as inputs a threshold adjustment signal and the data signal input by the phase adjustment circuit (1) and provides as output an amplified signal. The second amplifier (11) takes as input the signal output required by the first amplifier (10) and provides as output the amplitude-limited data signal output by the phase adjustment circuit (1). The subtractor takes as inputs the phase signals output from the phase adjustment circuit (2), and outputs a signal representing their difference. The threshold loop filter (13) takes as inputs the signal output from the first amplifier (10), the amplitude-limited signal output from the second amplifier (11), the difference signal output from the subtractor (12), and the mode signal input by the threshold adjustment circuit, and outputs the threshold value signal.

The phase adjustment circuit (2) comprises a rising edge phase detector (4), a falling edge phase detector (5), a summer (7), a phase loop filter (8), and an adjustable delay (6). The adjustable delay (6) receives the amplitude-limited data signal and a delay-adjustment signal as input and provides a delayed amplitude-limited data signal as output. Both the rising edge phase detector (4) and the falling edge phase detector (5) take both the delayed amplitude-limited data signal and a clock signal as inputs, and provide a phase error signal derived from the rising and falling edges of the delayed amplitude-limited data signal respectively. The summer (7) receives the phase error signals as inputs and provides their sum as an output signal. The phase loop filter (8) may receive a mode signal along with the sum of the phase error signals as inputs, and provides the delay-adjustment signal (input by the adjustable delay) as output.

The phase adjustment circuit (2) is described in detail below.

The retiming circuit (3) may be implemented using a single D-type bistable (15) receiving the delayed amplitude-limited data signal on its input D15, a clock signal on input C15, and providing the retimed data signal on output Q15.

The signal regenerator is adapted to receive a weak (including noisy and/or intermittent) electrical signal consisting of separated bursts of data, to amplify this and, using a clock input, to regenerate the data and output it. Control loops with switched time constants are used to learn the amplitude and phase of each burst of data. Transmitter and receiver are assumed to be synchronised.

Figure 2:
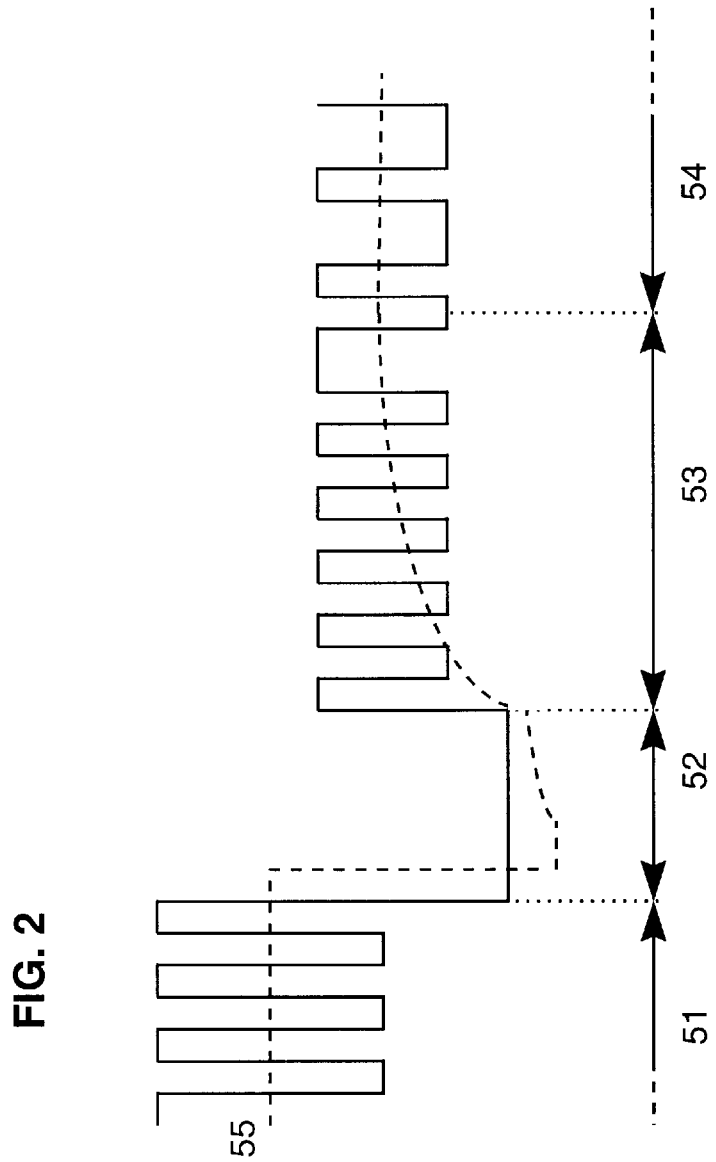
FIG. 2 shows a burst data format in accordance with the present invention.

Each burst of data is encoded as a synchronisation part followed by a data part, illustrated in FIG. 2, which shows the end (51) of a data burst followed by the beginning (52, 53, 54) of a second burst. In the example shown, the first data burst is a stronger signal than is the second burst.

The synchronisation part comprises a period of no signal (52) followed by a training period (53) comprising a bit pattern exhibiting a high occurrence of state changes, ideally containing a period in the form of a strictly alternating pattern of 1's and 0's. Where a pattern having a lower frequency of state changes is employed, the training pattern may have to be longer than that required in the ideal case.

The data part of each burst (54, 51) may be of arbitrary length, though this may be constrained by the characteristics of the phase adjustment circuit as described in more detail below.

A nominal threshold value as it might be set as the illustrated signal is received is shown as a dashed line (55).

The threshold adjustment system operates in multiple modes. A "learn" mode is intended for use during receipt of the synchronisation part of each burst; a "slow" mode is intended for use during receipt of the data part of each burst.

In "learn" mode a time-average of the signal received from the amplifier (11) is created by the threshold loop filter (13). The revised threshold signal is fed back to an input of the first amplifier (1). Where the signal contains a high frequency of rising and falling pulse edges (53), this feedback may bring the threshold (55) roughly to the correct value (i.e. the middle of the eye of the data signal) during receipt of, for example, a few tens of bits. This threshold acquisition process is started from the no-light side of the eye in order to achieve a quicker response where the signal strengths of successive bursts may vary widely. At data speeds of, for example, 6–10 Gbit/s, the threshold value may be determined within a few tens of nanoseconds.

Once the approximate threshold value has been found during "learn" mode, the threshold adjustment subsystem switches, or is switched, to "slow" mode. In this mode, further adjustment to the threshold value is determined based upon threshold error signals received from the phase adjustment circuit.

Alternatively, in "slow" mode, further adjustment to the threshold value may be determined using a time-average of the data stream, but with a time constant typically longer than that used in "learn" mode.

The data part of each burst may contain information relating to changing the operating mode of the signal generator, and from which the mode input signals may be derived by means of a suitable feedback loop. For example, the data part may include, inter alia, a header identifying the beginning of the data part, the length of the data part, or a special bit pattern indicating the end of the data part. Such mode-related information may be extracted from the re-timed data signal and fed back to the mode inputs of the signal regenerator. Alternatively, the mode signals may be derived either locally or from information derived from a distinct signalling channel associated with the data signal.

The mode input to the phase loop filter (8) may include modes to set the adjustable delay to an initial (typically mid-range) value, or to vary the filter characteristics (for example, the cut-off frequency). The range of modes may be either discrete or continuous according to the application.

The decision threshold adjustment system can cope with very large changes in signal level.

Where peak to peak wander and jitter in the data signal can be kept within known finite limits, and the phase adjustment subsystem (2) adapted accordingly, the receiver will also work with continuous data, for example SONET and SDH.

The receiver may be used in a cell-based (for example ATM) switch to receive successive bursts of, for example, one or more ATM cells, each successive burst potentially coming from a distinct signal source and therefore potentially varying widely both in signal strength and in phase.

Figure 3:
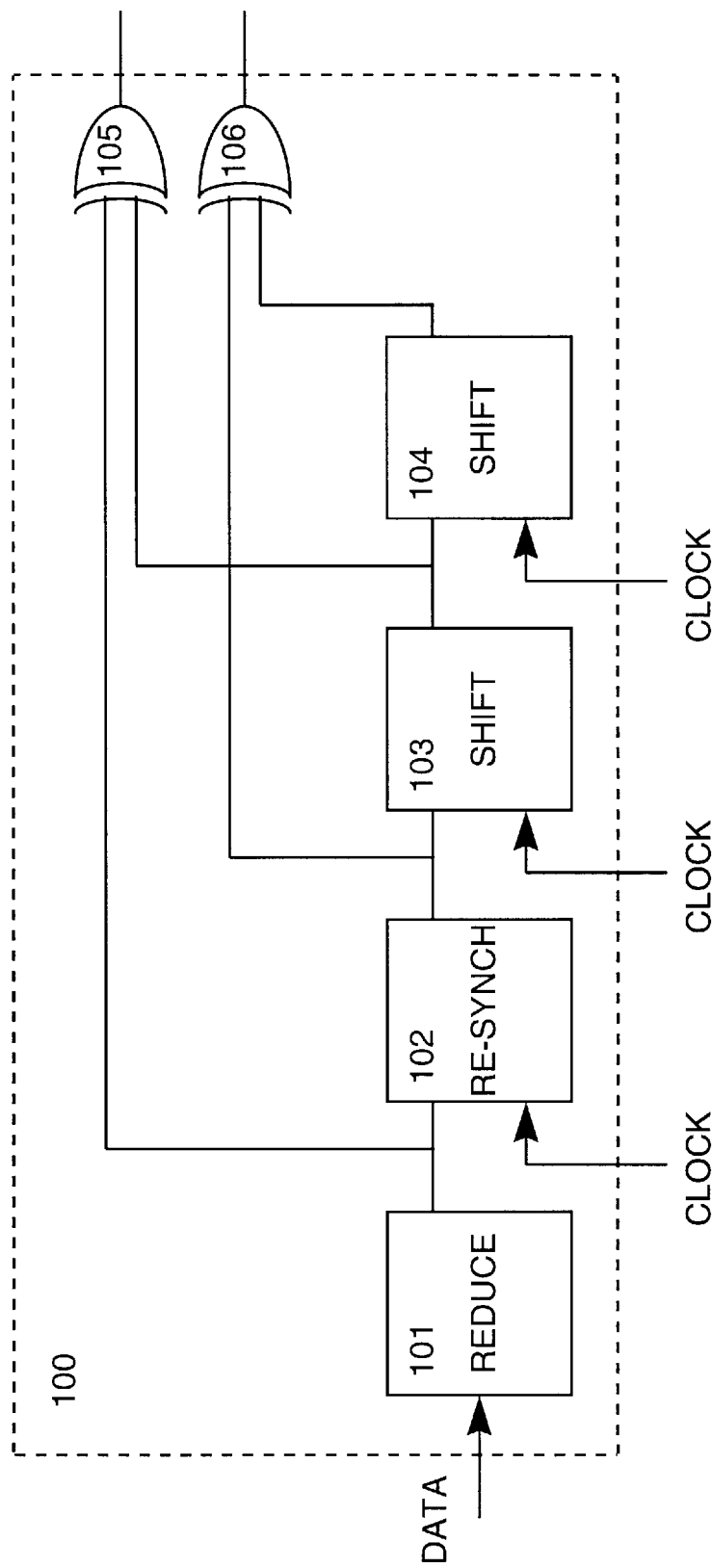
FIG. 3 shows a phase detector circuit diagram in accordance with the current invention.

A circuit diagram of a first embodiment of a phase detector (100) in accordance with the present invention is shown in FIG. 3, comprising: a data reduction circuit (101), a resynchronisation circuit (102), a first shift register circuit (103), a second shift register circuit (104), and first and second Exclusive OR (XOR) gates (105, 106).

The data reduction circuit (101) takes as input a data signal. The resynchronisation circuit (102) takes as inputs the output from the data reduction circuit (101) and a clock signal. The first shift register circuit (103) takes as inputs the output from the resynchronisation circuit (102) and a clock signal phase-shifted by an amount A. The second shift register circuit (104) takes as inputs the output from the first shift register circuit (103) and a clock signal phase-shifted by an amount A+B.

The first XOR gate (105) takes as inputs the output from the data reduction circuit (101) and the output from the first shift register circuit (103). The second XOR gate (106) takes as inputs the output from the resynchronisation circuit (102) and the output from the second shift register circuit (104).

The data-reduction circuit (101) is operable to produce a reduced data digital output signal which changes state responsive only to the receipt of positive-going state changes or only to the receipt of negative going state changes in the data signal. This reduces the speed requirements of subsequent parts of the apparatus since the frequency of state changes in the output signal is at most half that of the received data signal. Where the output signal does not change state upon receipt of every positive-going or negative-going state change, the frequency of state changes in the output signal will be reduced still further.

The resynchronisation circuit (102) is operable to receive a clock signal at a first input and, at a second input, an output from the data-reduction circuit and to provide a resynchronised reduced data signal.

The first shift register circuit (103) is operable to receive a clock signal phase shifted by an amount A at a first input and, at a second input, an output from the second circuit and to provide a resynchronised reduced data signal delayed by an amount A.

The second shift register circuit (104) is operable to receive a clock signal phase shifted by an amount A+B at a first input and, at a second input, an output from the third circuit (103) and to provide a resynchronised reduced data signal delayed by an amount A+B.

The first XOR gate (105) is operable to generate a phase difference signal between the reduced data signal and the delayed resynchronised reduced data signal.

The second XOR gate (106) is operable to generate a reference signal being the difference between the resynchronised reduced data signal and the resynchronised reduced data signal delayed an amount A+B.

The difference between the phase difference signal and the reference signal varies linearly with the phase difference between the data signal and the clock signal.

XOR gate (106) compares the edges of the signals output from the resynchronisation circuit (102) and the second shift register (104) respectively, to give a signal the duration of whose pulses is dependant only on the clock period. Pulse durations are as measured between the half-height points of the pulses. The frequency with which these pulses occur is dependent on the frequency of occurrence of rising edges in the data signal received by the data-reduction circuit (101).

XOR gate (105) compares the edges of signals output from the data reduction circuit (101) and the first shift register (103) respectively, giving rise to a signal having pulse widths dependent both on the clock period and on the difference in phase between the clock signal and the data signal received by the data reduction circuit (101). The use of the shift register to phase-shift the signal to one of the inputs of XOR gate (105) by an amount A means that the pulses in the signal output from XOR gate (105) vary in duration from A to A+1 clock cycles. In existing detectors, pulse durations in the phase signal vary between 0 and 1 clock cycles but, where the pulse durations of the phase signal fall below 0.5 clock cycles, the pulse duration does not vary linearly with the phase difference. By extending each pulse by a known amount and thereby ensuring that no pulse in the phase signal is narrow enough to fall in the range where the non-linearity occurs, the present invention avoids that source of non-linearity.

By comparing the pulse durations at the outputs of the two XOR gates (105, 106) it is possible to measure the phase difference between the clock signal and the data signal. This comparison may be done by integrating and subtracting the two signals to give a phase difference signal.

A phase difference signal so generated varies linearly with the phase difference between clock and data. Use of such a phase difference signal may permit construction of simpler and faster control loop mechanisms for the purpose of adjusting the phase difference between the clock signal and the data signal.

Figure 4:
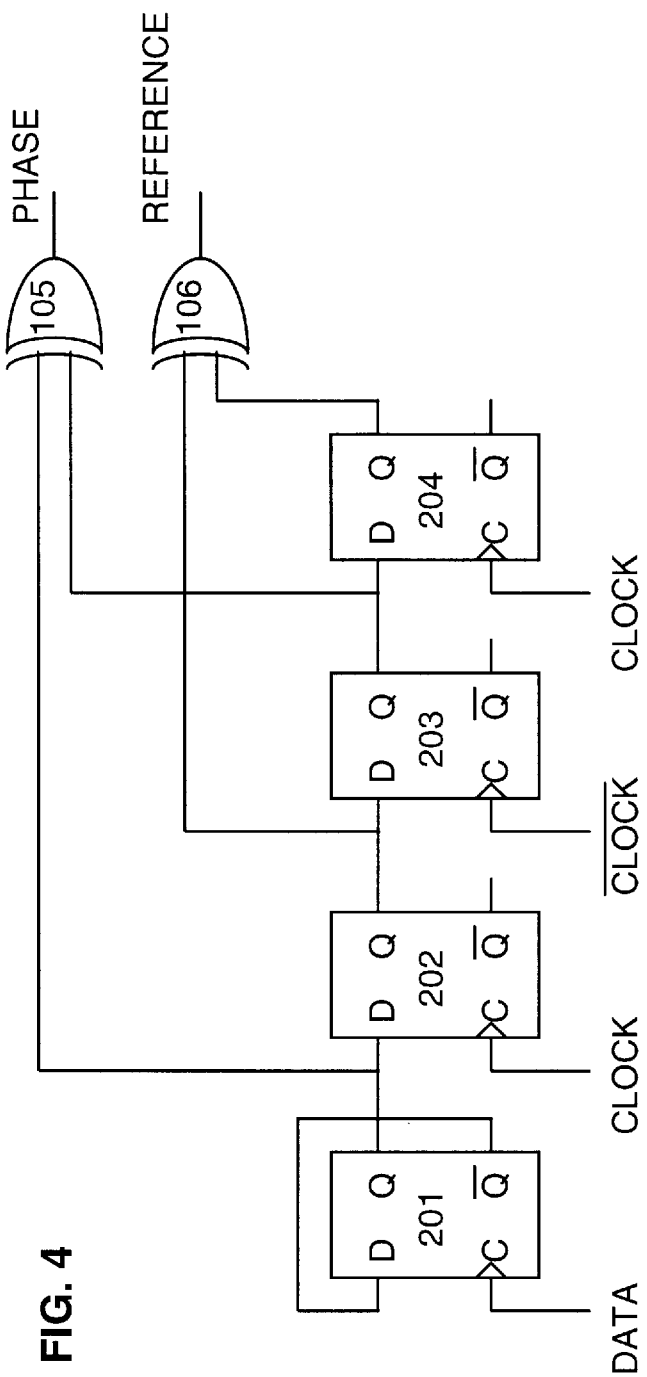
FIG. 4 shows a further phase detector circuit diagram in accordance with the current invention.

A circuit diagram of a further embodiment of a phase detector in accordance with the present invention is shown in FIG. 4, comprising: first and second D-Type bistables (201, 202), first and second Latches (203, 204), and first and second Exclusive OR gates (XOR gates) (105, 106).

D-Type (201) implements the data reduction circuit (101) of the first embodiment, D-Type (202) implements the resynchronisation circuit (102), latch (203) implements the first shift register (103), and latch (204) implements the second shift register (104).

D-Type (201) receives a data signal on input C201 and receives output from its own $\overline{Q201}$ output on input D201. D-Type (202) receives, on input D202, the signal from output Q201 of D-Type (201), and receives a clock signal on input C201.

Latch (203) receives, on input D203, the signal from output Q202 of D-type (202) and receives a $\overline{\text{clock}}$ signal on input C203. Latch (204) receives, on input D204, the signal from output Q3 of the first latch (203) and receives a clock signal on input C204.

XOR gate (105) receives, as inputs, signals from output Q201 of D-Type (201) and output Q203 of latch (203) respectively. XOR gate (106) receives, as inputs, signals from output Q202 of D-Type (202) and output Q204 of latch (204) respectively.

The output signal states of D-Type (201) change only on rising edges of the data signal arriving on input C201. Edges occur in the signal on output Q201 of D-Type (201) at a half the frequency of edges in the data signal (that is, the frequency of edges is reduced by a factor of two). D-Type (201) could also be arranged so that it changes state on the falling edges of the data signal. One means of achieving this is to invert the data signal before it arrives at D-Type (201). D-Type (201) would then operate upon rising edges in the inverted data signal. Rising edges in inverted data signal correspond to falling edges in the data signal and so the desired effect would be achieved.

The D-Types employed in this embodiment are positive edge triggered. Each rising edge in the data signal therefore causes a change on the Q201 output signal of D-type (201) (the reduced data signal) with edge timing that depends on the data signal. This change propagates through D-type (202) and latches (203) and (204) with edge timing determined by the clock or $\overline{\text{clock}}$. Hence the signal output from D-type (202) (the synchronised reduced data signal) is identical to that output from D-type (201) except in that the synchronised reduced data signal is further phase-shifted so as to bring it into synchronisation with the clock.

The latches are transparent when the clock is high: output signals change state in response to changes in state in the D input signal only when the clock signal is high; when the clock signal is low, the output state remains unchanged. Each latch introduces a phase shift of 0.5 clock cycles.

In this embodiment, pulses in the signal output by XOR gate (106) have a nominal duration of one clock period. Pulses output by XOR gate (105) vary in duration from 0.5 to 1.5 clock cycles.

Advantageously, critical timing paths through the circuit exhibit similar propagation delays. This is achieved by ensuring that signals pass through the same number of bistable devices. The circuit is therefore largely insensitive to changes in the characteristics of the components so long as they all move together, as they would in an integrated circuit implementation.

Using bistables or other components having characteristic properties similar to those required of latches in this construction in place of the latches would achieve a similar purpose, but at the possible cost of occupying a greater surface area in an integrated chip implementation. Similar replacement of the D-type bistables by circuits having the requisite characteristics would be evident to a person skilled in the art.

Figure 5:
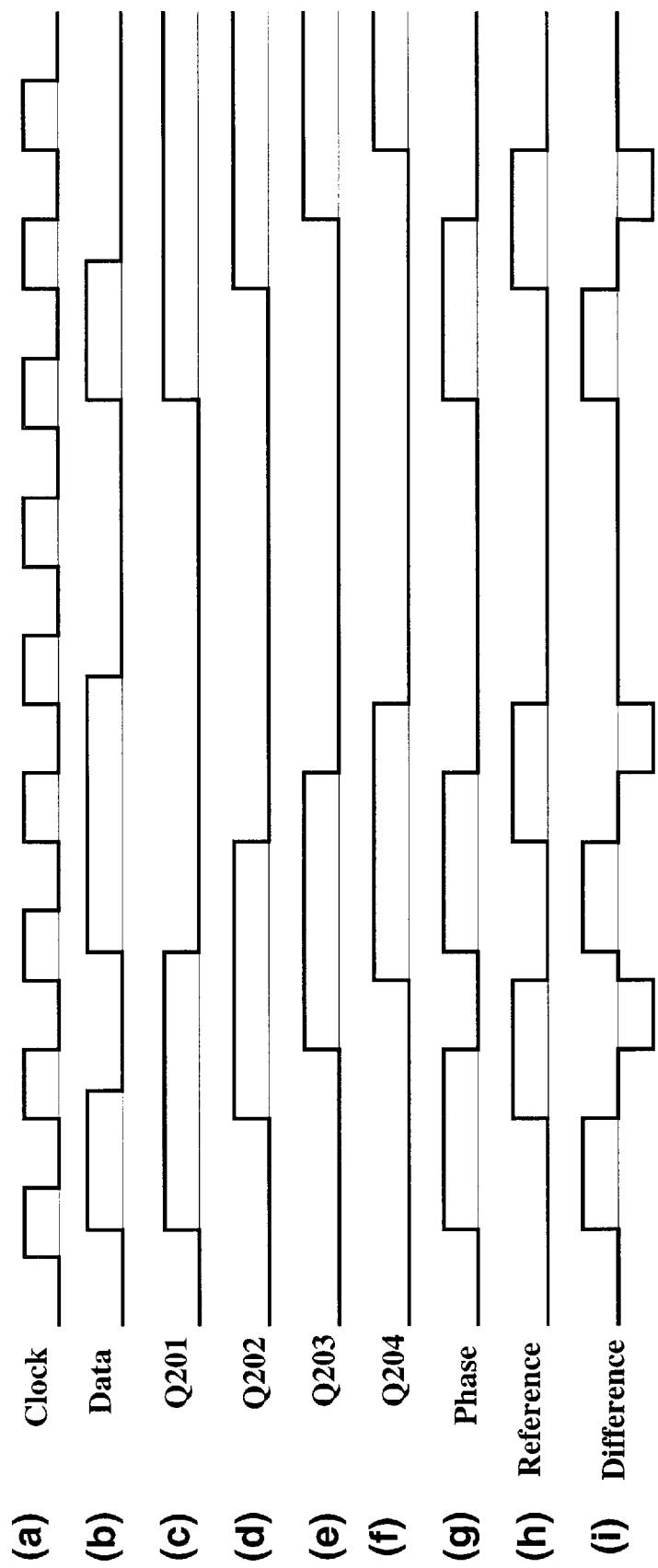
FIG. 5 shows examples of data signals at specific points in the circuit depicted in FIG. 4.

Example signals at selected points in the circuit shown in FIG. 4 are shown in FIG. 5. The signals shown are (a) an example clock signal and (b) an example data signal, followed by (c) the Q201 output signal from D-Type (201), (d) the Q202 output of D-Type (202), (e) the Q3 output of latch (203), (f) the Q204 output of latch (204), (g) the phase signal output from XOR (105), and (h) the reference signal output from XOR (106). FIG. 5(i) shows the difference between the phase signal (FIG. 5(g)) output from the first XOR (105), and the reference signal (FIG. 5(h)) output from the second XOR (106).

Figure 6:
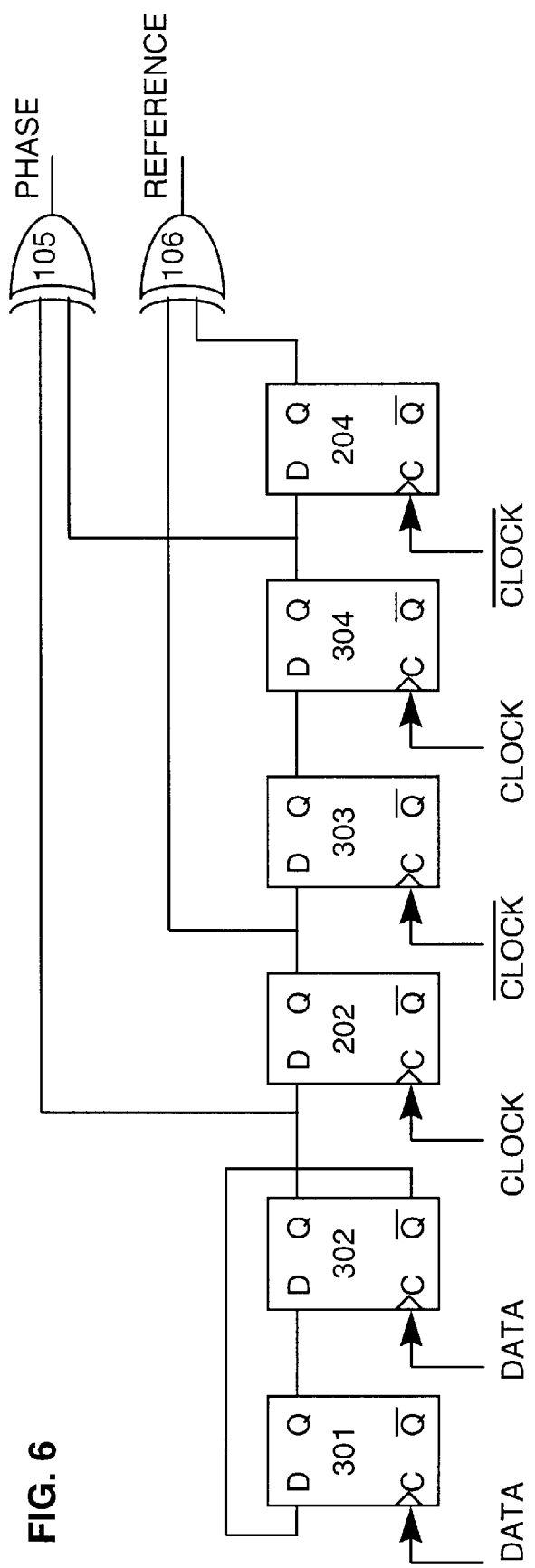
FIG. 6 shows an embodiment of phase detector in accordance with the current invention.

A further embodiment of a phase detector in accordance with the present invention, shown in FIG. 6, is similar to the second embodiment in FIG. 4, except in the implementation of the data-reduction circuit (101) and the first shift register (103).

The data-reduction circuit in this embodiment comprises two D-types (301, 302); the first shift register comprises two latches (303, 304).

D-type (301) receives a data signal on input C301 and the output from $\overline{Q}$ 302 on input D301. D-type (302) receives the data signal on input C302 and the output from Q301 on input D302. A reduced data signal is output from Q302.

Latch (303) receives a resynchronised reduced data signal on input D303 and a $\overline{\text{clock}}$ signal on input C303. Latch (304) receives output from Q303 on input D304, and a clock signal on input C304.

Latch (204) receives on input D204 the output signal from Q304 and receives a $\overline{\text{clock}}$ signal on input C204.

The synchronised reduced data signal output at Q304 is phase-shifted by one clock cycle with respect to the reduced data signal input at D303.

The signal output at Q204 is further phase-shifted by 0.5 clock cycles.

In this embodiment, pulses in the signal output by the XOR gate (106) have a nominal duration of 1.5 clock periods. Pulses output by XOR gate (105) vary in duration from 1.0 to 2.0 clock periods In this embodiment, the signal on the Q output of D-Type (302) changes state only on every second rising edge of the data signal (that is, the frequency of edges is reduced by a factor of four) and pulses in the signal representing the phase difference vary in duration between 1.0 and 2.0 clock periods.

Figure 7:
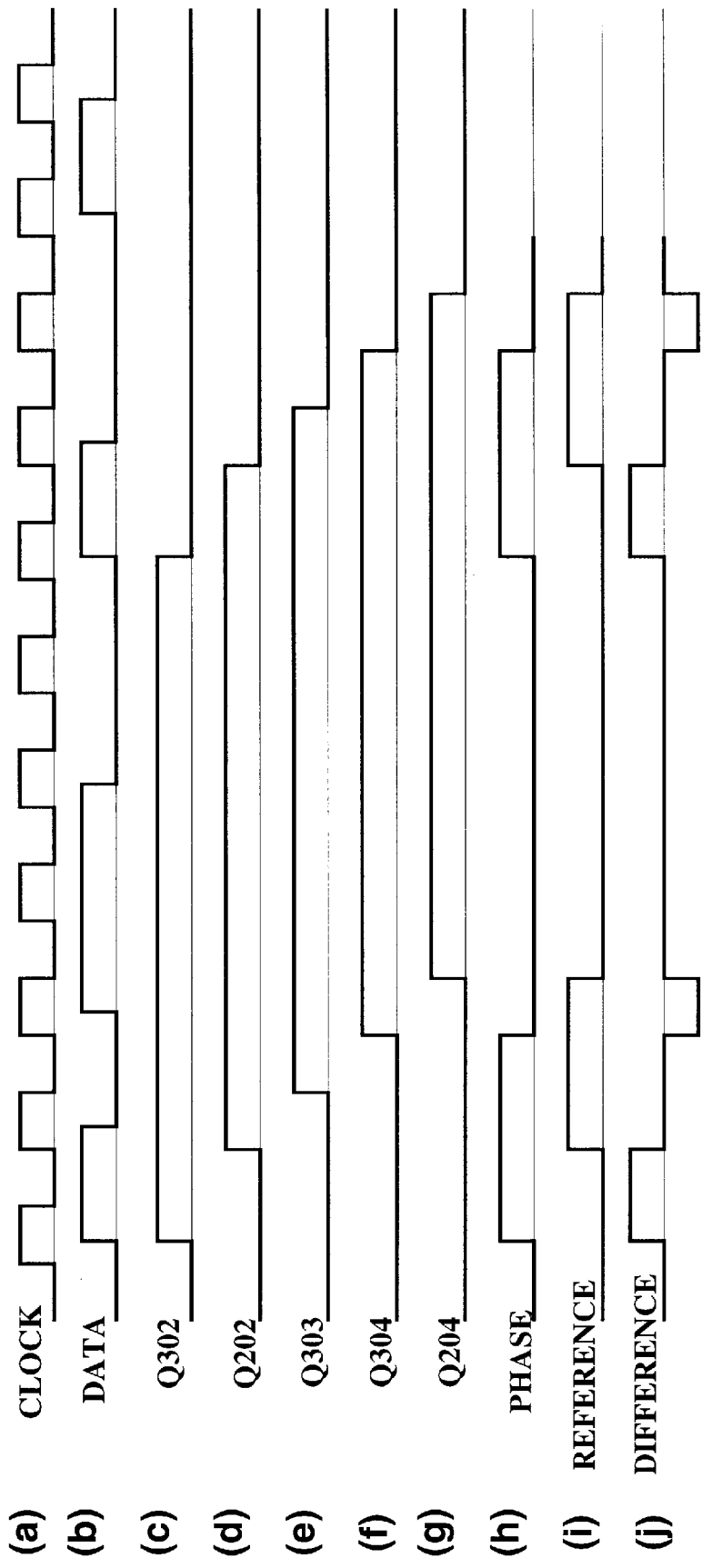
FIG. 7 shows examples of data signals at specific points in the circuit depicted in FIG. 6.

Example signals at selected points in the circuit shown in FIG. 6 are shown in FIG. 7. The signals shown are (a) an example clock signal and (b) an example data signal, followed in turn by the resultant output from (c) the Q output of D-Type (302), (d) the Q output of D-Type (202), (e) the Q output of latch (303), (f) the Q output of latch (304), (g)

the Q output of latch (204), (h) the phase signal output from the first XOR (105), and (i) the reference signal output from the second XOR (106). FIG. 7(j) shows the difference between (h) the phase signal output from the first XOR (105), and (i) the reference signal output from the second XOR (106).

It would be possible to further vary the range of the phase difference signal pulse durations by addition to the circuit of further D-types and latches in an obvious way.

Figure 8:
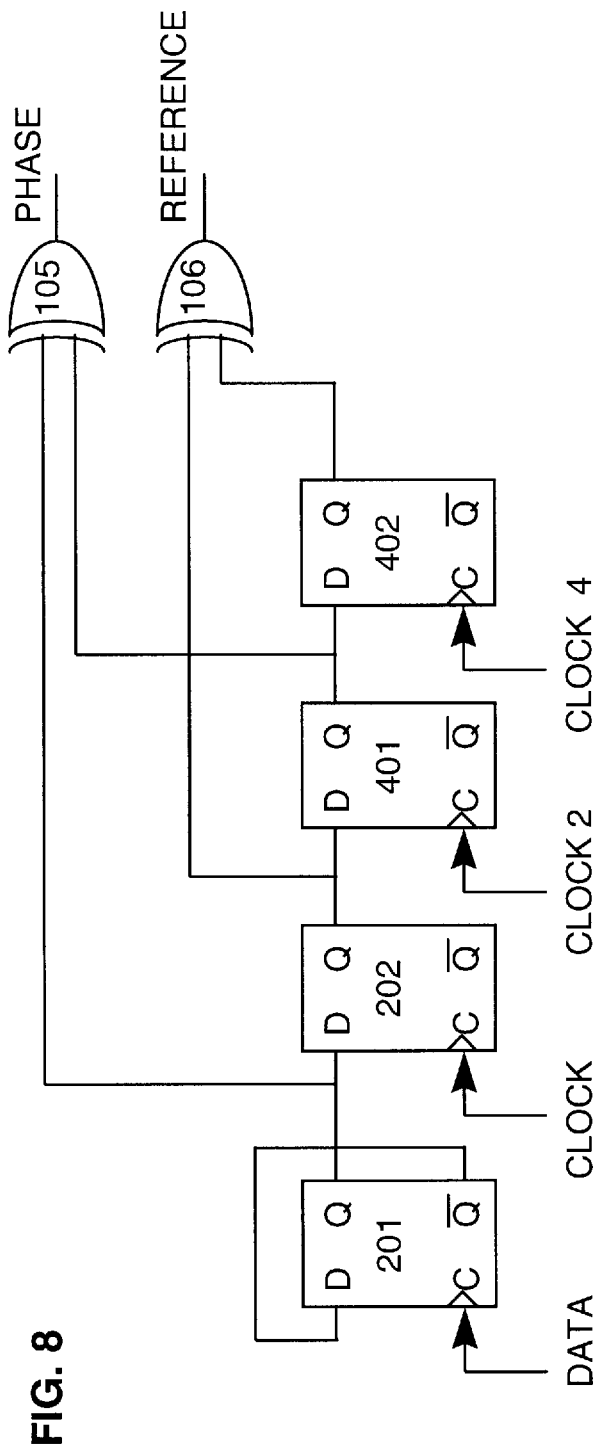
FIG. 8 shows a circuit diagram of another embodiment of a phase detector in accordance with the current invention.

It is also possible to employ a poly-phase clock rather than a two-phase clock, and FIG. 8 shows a third embodiment of a phase detector as an example. The circuit of FIG. 8 employs a four-phase clock signal and outputs a phase signal having pulse durations in the range from 0.75 and 1.75 clock periods.

In this embodiment, both shift registers (103, 104) in the first embodiment are implemented by D-types (401, 402). Furthermore, D-types (401) receives on input C401 a signal being the second phase of the clock, whilst the second replacement D-type (402) receives on input C402 a signal being the fourth phase of the clock.

Figure 9:
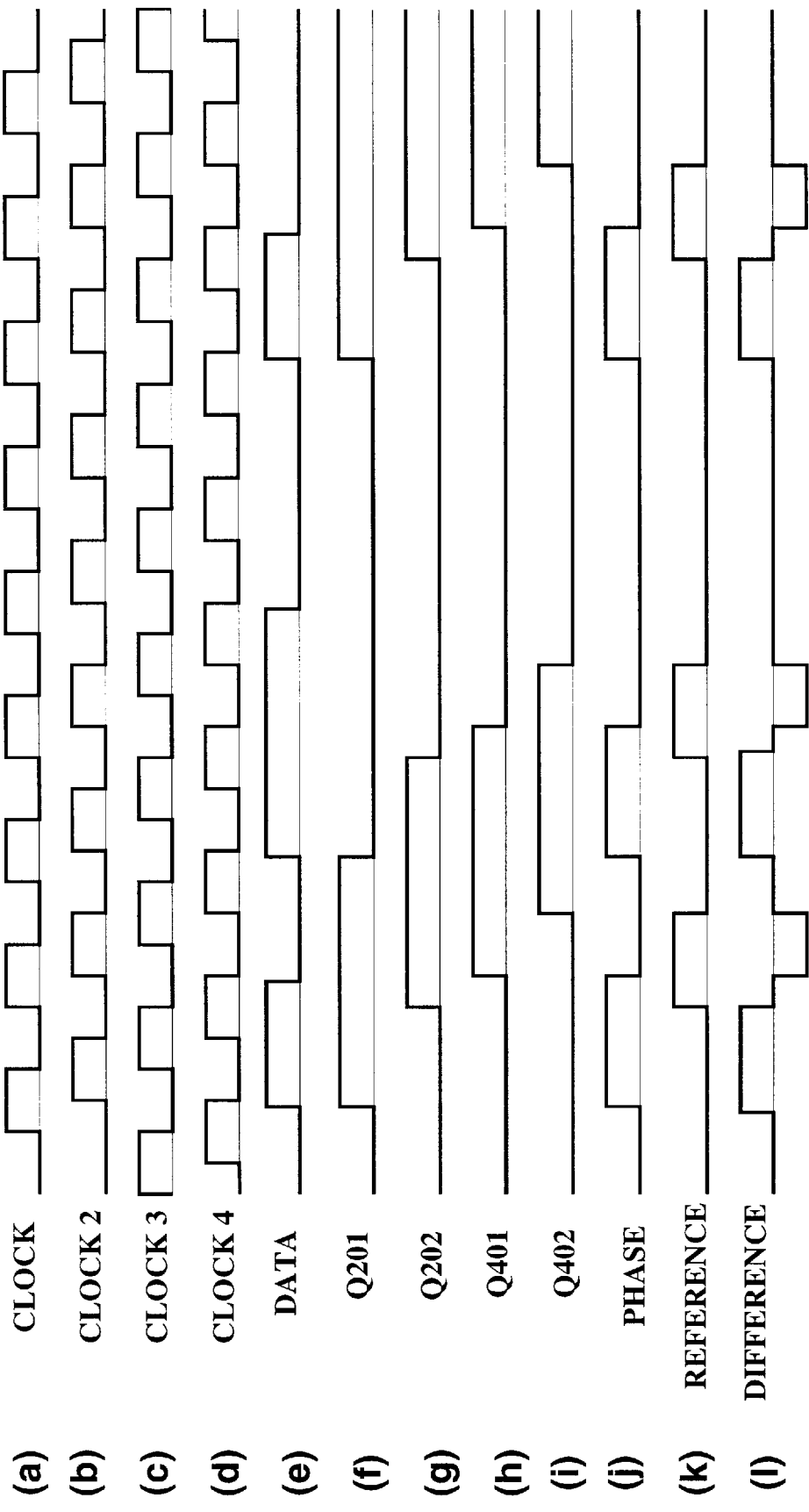
FIG. 9 shows examples of data signals at specific points in the circuit depicted in FIG. 8.

Example signals at selected points in the circuit shown in FIG. 8 are shown in FIG. 9. The signals shown are (a–d) example signals of representative phases of a four-phase clock and (e) an example data signal, (f) the resultant outputs from Q 201 of the first D-Type (201), (g) output Q 202 of D-Type (202), (h) outputs Q 401 of D-Type (401), (i) output Q 402 of D-Type (402), (j) the phase signal output from the first XOR (105), and (k) the reference signal output from the second XOR (106). FIG. 9(l) shows the difference between (j) the phase signal output from the first XOR (105), and (k) the reference signal output from the second XOR (106).

As in the second embodiment, it would be possible to vary the range of the phase difference signal pulse durations by extension of the data-reduction circuit (101) and the first shift register (103).

Figure 10:
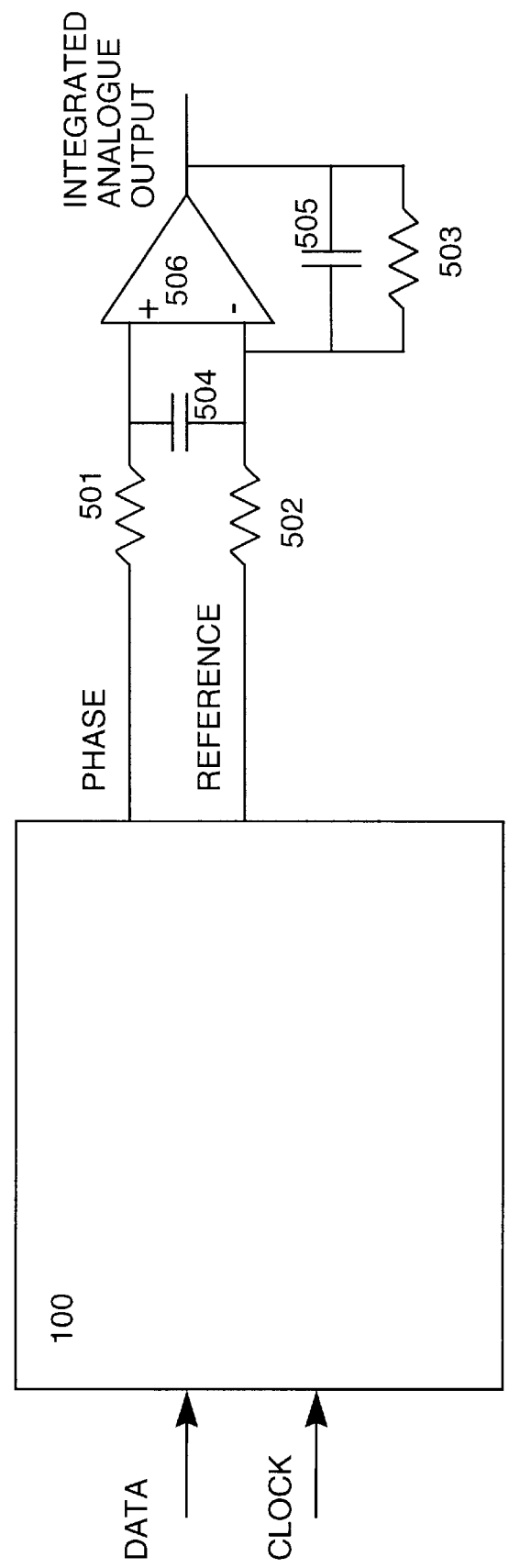
FIG. 10 shows a block diagram of a further embodiment of a phase detector in accordance with the current invention.

In a further embodiment of a phase detector, illustrated in FIG. 10, additional circuitry provides an integrated analogue output signal as the phase difference signal. In addition to the first embodiment of a phase detector (100), the circuitry comprises: three resistors (501, 502, 503), two capacitors (504, 505) and an amplifier (506).

The phase detector (100) receives as inputs a data signal and one or more clock signals. The phase signal output from the phase detector (100) is provided as input to the first resistor (501), whilst the reference output signal from the phase detector (100) is provided as input to the second resistor (502). Output from the first resistor (501) is connected both to the positive input line of the amplifier (506) and to one side of the first capacitor (504); output from the second resistor (502) is connected both to the negative input line of the amplifier (506) and to the other side of the first capacitor (504). The remaining resistor (503) and capacitor (505) are connected in parallel between the output from the second resistor (502) and the output from the amplifier (506).

The additional circuitry is provided both to subtract the reference signal from the phase signal and to smooth the resultant phase difference signal. The amplitude of the resulting integrated analogue signal is linearly related to the difference in phase between the data signal and the clock signal.

The phase difference indicated by the circuit is dependant on the transition density of the incoming data signal, however the midpoint (the balanced condition where the reference signal is a time shifted version of the phase signal) is not affected.

Figure 11:
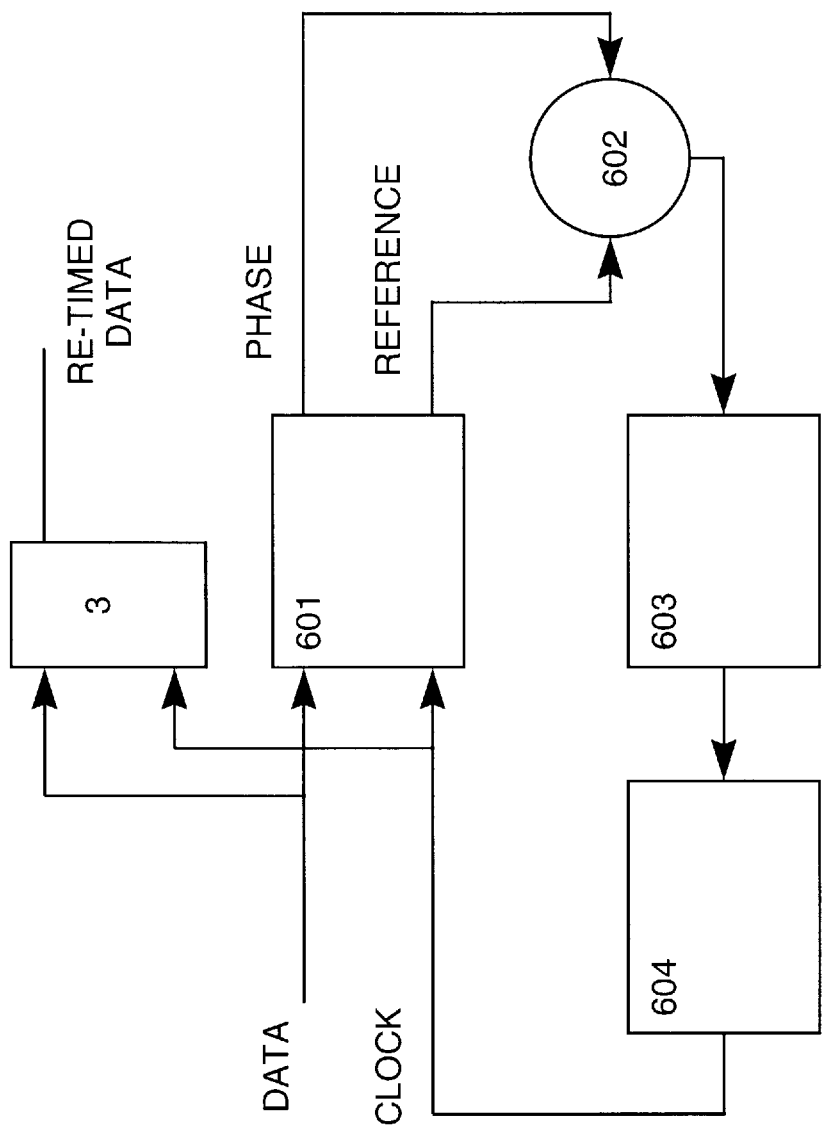
FIG. 11 shows a block diagram of a further embodiment of a phase detector in accordance with the current invention.

A phase detector can be provided, in a further embodiment, as part of a phase locked loop circuit as shown in FIG. 11, comprising a phase detector (601), a subtractor (602), a loop filter (603), an adjustable oscillator (604) (for example a voltage controlled oscillator), and a re-timing circuit (3).

A data signal is provided as input both to the phase detector (601) and as the data input to the re-timing circuit (3). The phase signal and reference signal output from the phase detector (601) are provided as inputs to the subtractor (602). The output signal from the subtractor (602) is provided as input to the loop filter (603); output from the loop filter is provided as input to the adjustable oscillator (604). Output from the adjustable oscillator (604) is provided both to the clock input of the phase detector (601) and to the clock input of the re-timing circuit (3). The output signal from output Q 602 of D-Type (602) is a re-timed data signal.

The subtractor (602) and loop filter (603) use the phase difference information provided from the phase detector output signals to vary the frequency of the clock signal generated by the adjustable oscillator so as to reduce the phase difference between the clock signal and the data signal. The D-type acts to regenerate the data signal retimed in synchronisation with the clock signal.

Figure 12:
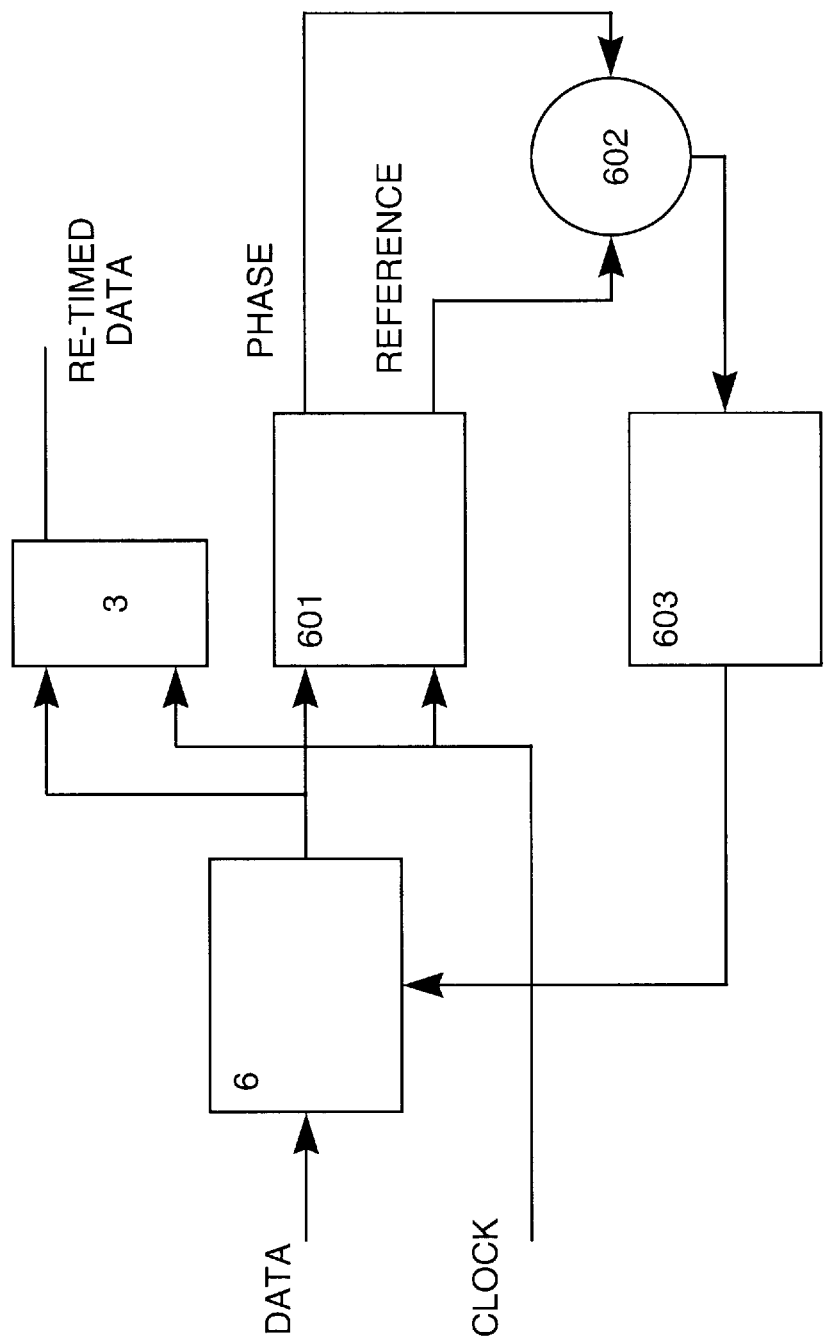
FIG. 12 shows a block diagram of a still further embodiment of a phase detector in accordance with the current invention.

In a still further embodiment, a phase detector is provided as part of a circuit to control data delay to re-time a data signal. An example of such a circuit is shown in FIG. 12, comprising: an adjustable delay (6) (for example, a voltage controlled delay), a re-timing circuit (3), a phase detector (601), a subtractor (602), and a loop filter (603).

A free running clock signal is provided as input to both the phase detector (601) and as the clock input to re-timing circuit (3). In addition, a data signal output from the adjustable delay (6) is provided as input both to the phase detector (601) and to the data input of re-timing circuit (3).

The phase signal and reference signal output from the phase detector (601) are provided as inputs to the subtractor (602).

The output signal from the subtractor (602) is provided as input to the loop filter (603); output from the loop filter is provided as input to the adjustable data delay (6), which also receives a data signal as input.

The signal output from re-timing circuit (3) is the re-timed data signal.

The subtractor (602) and loop filter (603) use the phase difference information provided from the phase detector output signals to vary the length of delay introduced in the data signal path so as to reduce the phase difference between the clock signal and the data signal. The re-timing circuit (3) acts to regenerate the data signal retimed in synchronisation with the clock signal.

In a still further embodiment, in which the data signal is itself a clock signal, the detector in all its embodiments may be employed as a clock-to-clock phase detector, provided that the data-reduction factor exceeds two.

Figure 13:
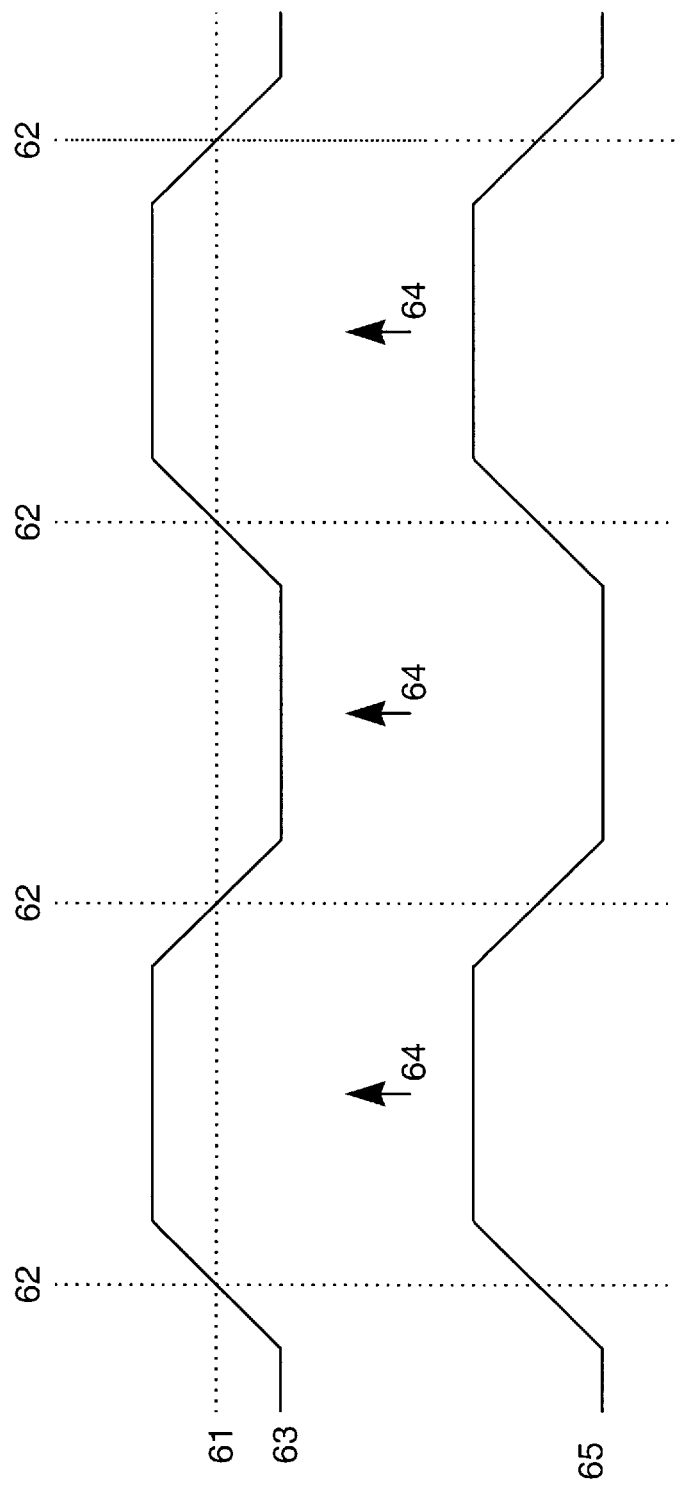
FIG. 13 shows an example of an ideal data signal exhibiting neither threshold error nor phase error.

Ideally, threshold values and clock phase are set such that, when applied to a received data signal, they coincide exactly with the actual phase and threshold characteristics of the data signal. An example of this situation is shown in FIG. 13. The threshold value (shown as a horizontal dashed line) is set at half the amplitude of the data signal, and the clock phases (shown as vertical dashed lines) occur perfectly in synchronisation with the points at which the data signal crosses the threshold value.

In practice, however, it is likely that either the threshold value is set too high or too low (a threshold error) or that the data arrives out of phase with the clock pulses (a phase error), or both (a compound phase/threshold error).

A threshold error is characterised in that either (a) rising edges of the data signal are detected to arrive late and falling edges to arrive early with respect to the clock pulses or (b) rising edges of the data signal are detected to arrive early and falling edges to arrive late with respect to the clock pulses. The former case indicates that the threshold has been set too high; the latter case indicates that the threshold has been set too low.

A phase error is characterised in that either (a) both rising edges and falling edges of the data signal are detected to arrive late with respect to the clock pulses or (b) both rising edges and falling edges of the data signal are detected to arrive early with respect to the clock pulses. The former case indicates that the data signal is late with respect to the clock; the latter case indicates that the data signal is early with respect to the clock.

A compound phase/threshold error is characterised in that whilst both rising edges and falling edges are either both late or both early, the degree of late or early arrival of rising edges differs from that of falling edges.

By way of example, FIGS. 13–16 illustrate four cases: the ideal case of neither phase nor threshold error; threshold error but no phase error; phase error but no threshold error; and both threshold error and phase error.

FIG. 13 shows an incoming data signal (63), the re-timing clock (64), the threshold (61) and the ideal positions for the data transitions (62). The data signal is sliced at the threshold and the resultant signal is shown (65). In this case the incoming data (63) is ideally placed with respect to the threshold (61) and ideal transition positions (62) and the sliced data (65) is a faithful copy of the original.

Figure 14:
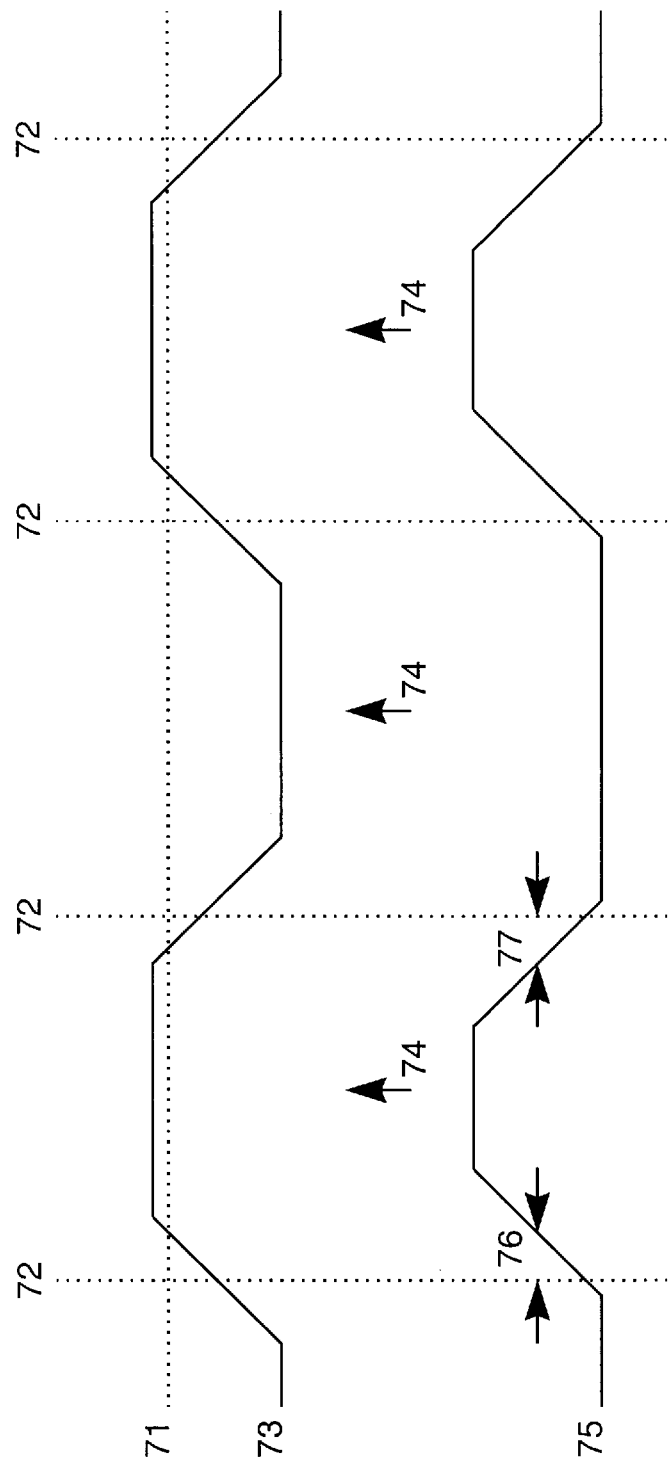
FIG. 14 shows an example of a data signal exhibiting a threshold error but no phase error.

FIG. 14 shows an incoming data signal (73), the re-timing clock (74), the threshold (71) and the ideal positions for the data transitions (72). The data signal is sliced at the threshold and the resultant data signal is shown (75). In this case the threshold for the incoming data (71) is too high although the transitions are correctly positioned. The sliced data signal (75) now has late rising edges (76) and early falling edges (77) characteristic of a high threshold value (threshold error).

Figure 15:
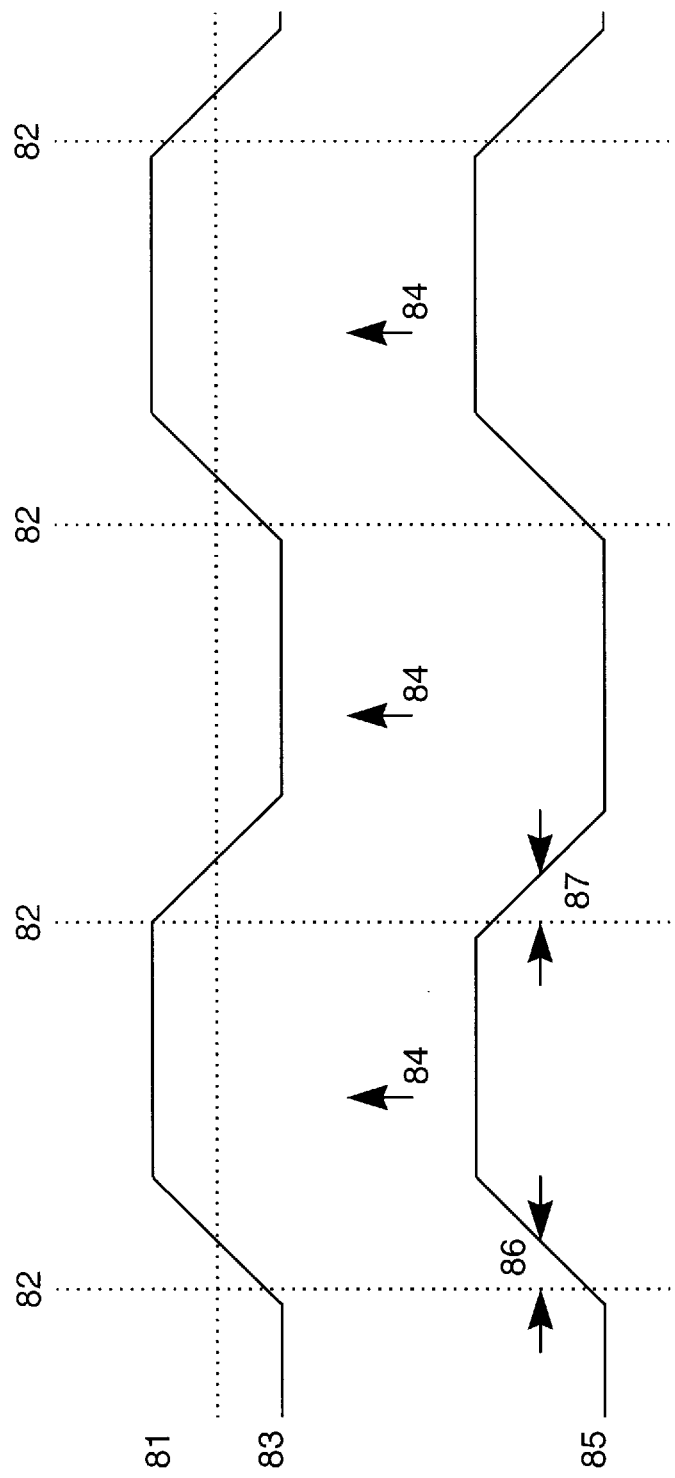
FIG. 15 shows an example of a data signal exhibiting a phase error but no threshold error.

FIG. 15 shows an incoming data signal (83), the re-timing clock (84), the threshold (81) and the ideal positions for the data transitions (82). The data signal is sliced at the threshold and the resultant data signal is shown (85). In this case the data signal is late with respect to ideal transition positions (82) although the threshold is correctly positioned. The sliced data signal (85) now has late rising edges (86) and late falling edges (87) characteristic of a late data signal (phase error).

Figure 16:
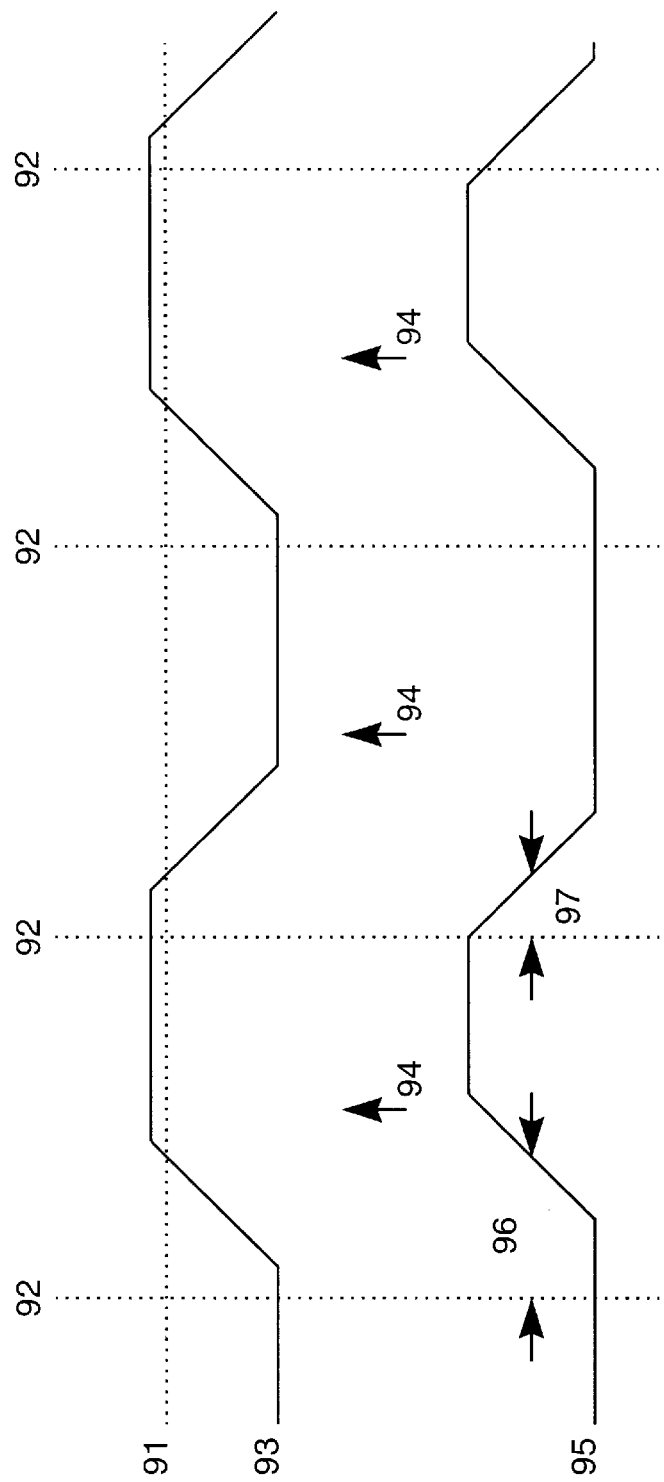
FIG. 16 shows an example of a data signal exhibiting both a threshold error and a phase error.

FIG. 16 shows an incoming data signal (93), the re-timing clock (94), the threshold (91) and the ideal positions for the data transitions (92). The data signal is sliced at the threshold and the resultant data signal is shown (95). In this case the data signal is late with respect to ideal transition positions (92) and the threshold is too high. The sliced data signal (95) now has very late rising edges (96) and late falling edges (97) characteristic of both a late data signal (phase error) and a high threshold.

Figure 17:
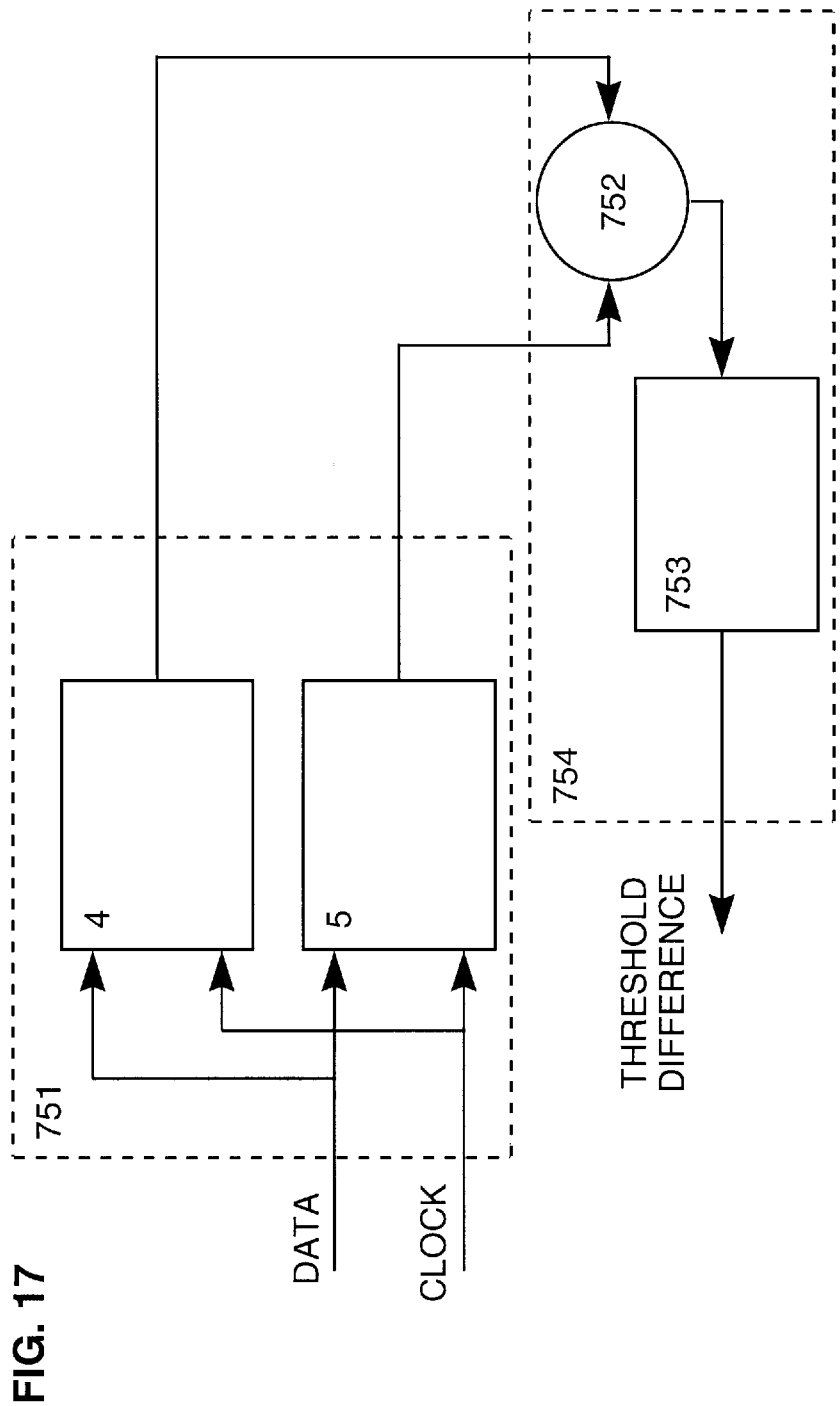
FIG. 17 shows a block diagram of a threshold detector in accordance with the present invention.

A block circuit diagram for a first embodiment of a threshold detector in accordance with the present invention is shown in FIG. 17. This first embodiment comprises: a rising/falling phase detector (751), a subtractor (752), and a loop filter (753). Together, the subtractor (752) and the loop filter (753) constitute an example of a threshold differencer (754).

The threshold differencer (754) may be implemented by alternative means which achieve the same net effect.

The rising/falling phase detector (751) has both a clock signal and a data signal as inputs, and has distinct phase difference signals as outputs. Each phase difference signal represents a difference in phase between the clock signal and the data signal: the first phase difference signal is derived from the timing of the rising edges of the data signal and varies with the phase difference between the clock and the rising edges of the data signal; the second phase difference signal is derived from the timing of the falling edges of the data signal and varies with the phase difference between the clock and the falling edges of the data signal.

In a preferred embodiment, such a rising/falling phase detector (751) may be constructed using a rising edge phase detector (4) in parallel with a falling edge phase detector (5) as shown in FIG. 17. Each component phase detector takes as input both the data signal and the clock signal received by the rising/falling phase detector and outputs a single phase difference signal. The phase detectors differ in that the rising edge phase detector (4) outputs a signal which varies linearly with the phase difference between the clock and the rising edges of the data signal; the falling edge phase detector is derived from the timing of the falling edges of the data signal and varies linearly with the phase difference between the clock and the falling edges of the data signal. As a consequence of the difference in their operation, the component phase detectors need not generate identical phase difference signals even when they each receive the same data signal, for example when the data mark-space ratio is not 1:1.

The subtractor (752) receives as inputs the phase difference signals from the rising/falling phase detector (751) and outputs a signal which represents the difference between the received phase difference signals.

The loop filter (753) receives as input the signal output from the subtractor (752) and outputs a signal which varies with the difference between the threshold value used in generating the received data signal and the true value of that signal's threshold. In embodiments in which the outputs from the rising/falling phase detector (751) vary linearly with the phase differences between the data signal and the clock signal, the loop filter output varies linearly with the difference between the threshold value used in generating the received data signal and the true value of that signal's threshold.

Figure 18:
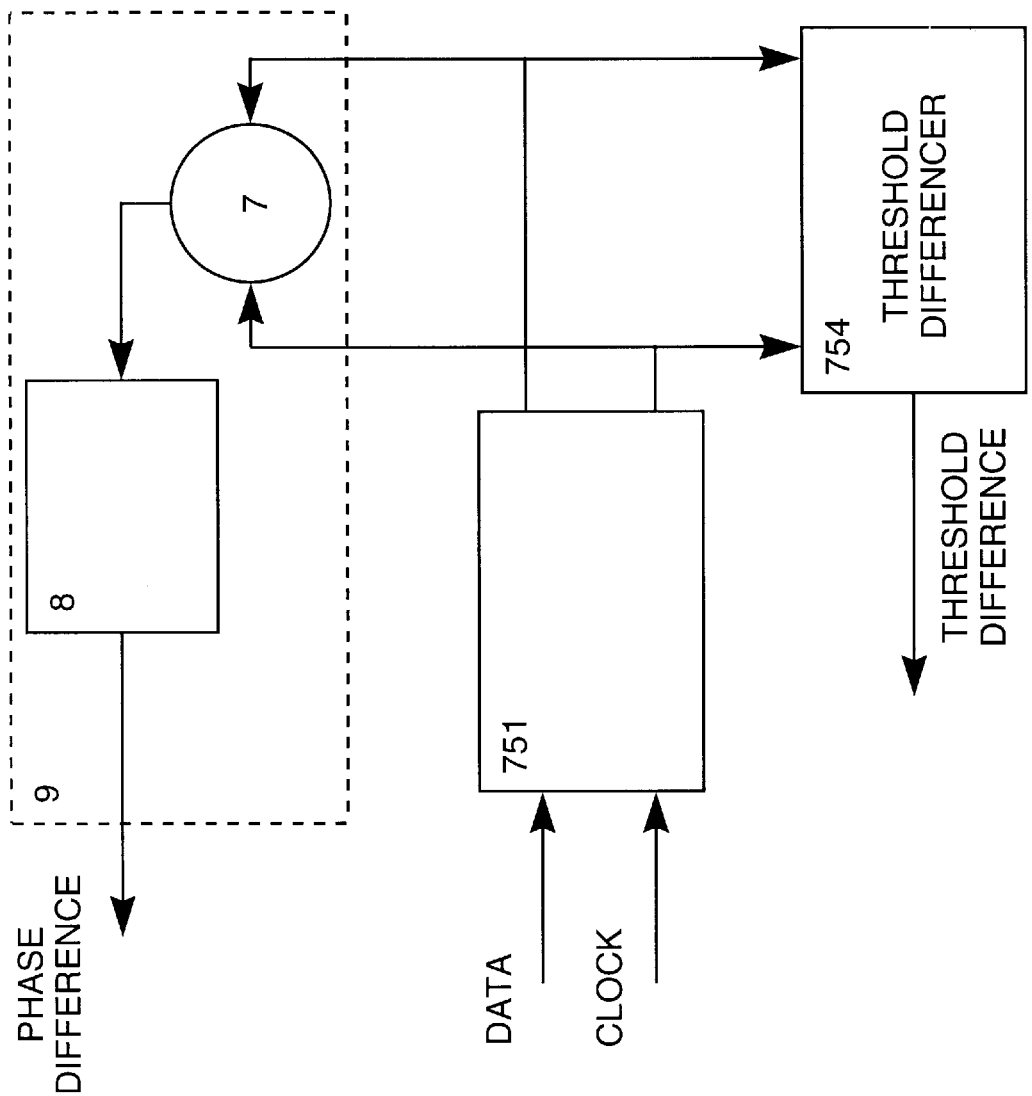
FIG. 18 shows a block diagram of a combined threshold and phase detector in accordance with the present invention.

A block circuit diagram for a second embodiment in accordance with the present invention is shown in FIG. 18. This embodiment comprises: a rising/falling phase detector (751), a summer (7), a loop filter (8), and a threshold differencer (754).

The summer (7) and the loop filter (8) constitute an example of a phase differencer (9).

This embodiment differs from the first embodiment in that the phase differencer (9) is added to the circuit: the summer (7) receives as inputs the phase difference signals from the rising/falling phase detector (1) and outputs a signal which represents the sum of the received phase difference signals; the loop filter (8) receives as input the signal output from the summer (7) and in turn outputs a signal, which varies linearly with the difference between the phase of the data signal and the phase of the clock.

This embodiment differs from the first embodiment in that, in addition to providing an output signal which varies linearly with the difference between the threshold value used in generating the received data signal and the true value of that signal's threshold, it also provides a phase difference signal which (a) varies linearly with the difference between the phase of the data signal and the phase of the clock signal and (b) is derived from information derived both from rising edges and from falling edges of the data signal.

Current practice employs separate detector circuitry to extract phase information and threshold information. Common use of one or more components by both detector circuits would give a reduction both in silicon used and power required.

In this embodiment, shared use is made of a rising/falling phase detector to generate signals both for threshold difference and for phase difference, thereby minimising the overall circuitry required. In this way both threshold and phase error signals are derived from measurement of a single characteristic of the received data signal: namely measurement of the times at which the transition edges of the received data signal passes a given threshold voltage.

Figure 19:
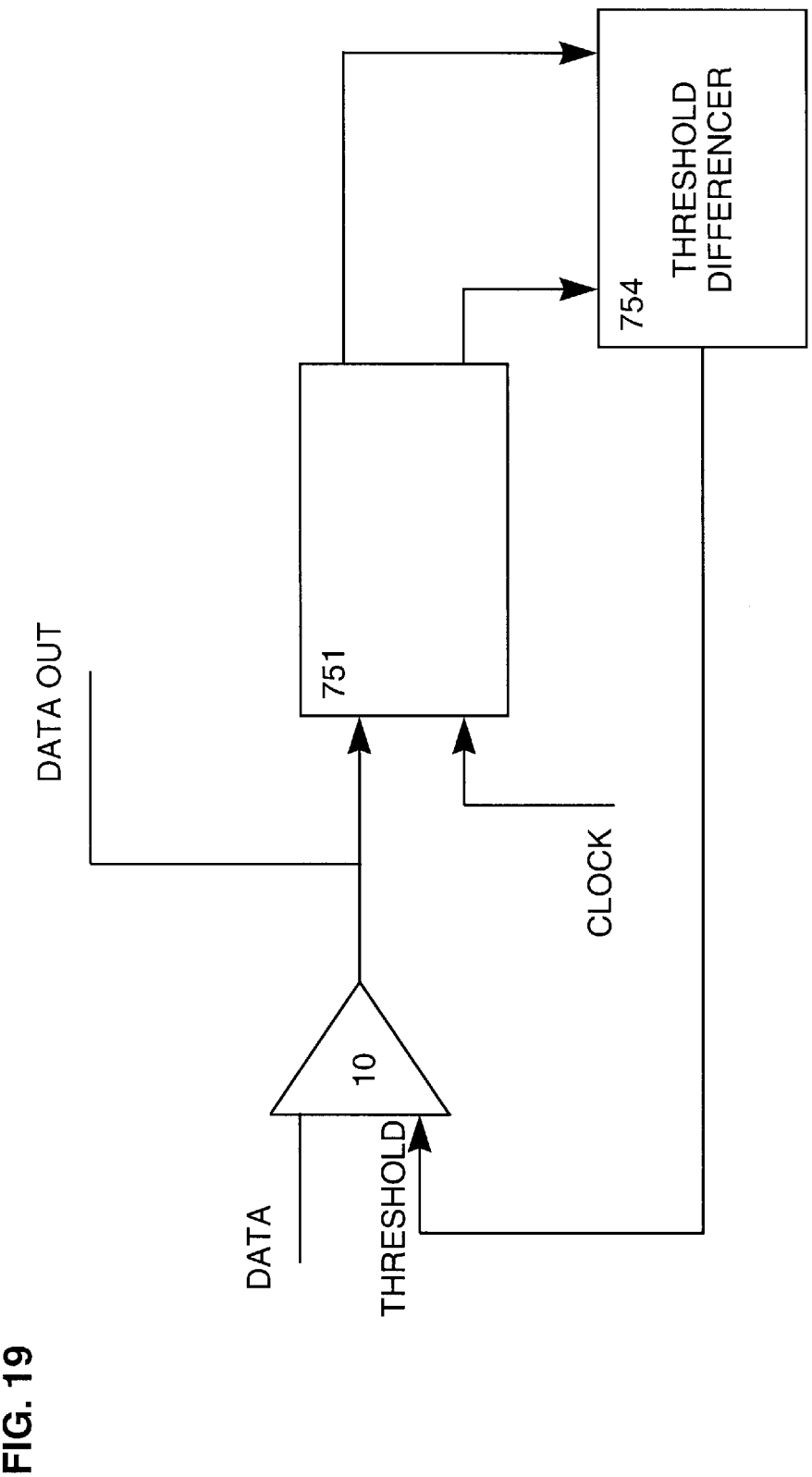
FIG. 19 shows a block diagram of a threshold tracking system in accordance with the present invention.

A block circuit diagram for a third embodiment of a threshold detector in accordance with the present invention is shown in FIG. 19. This first embodiment comprises: a rising/falling phase detector (751), a threshold differencer (754), and an amplifier (10).

This embodiment differs from the first embodiment in that an amplifier is added to complete a feedback circuit: the rising/falling phase detector (751) receives as input both the clock signal and the signal (the data-out signal) output from the amplifier (10); the amplifier (10) receives as input both the data signal and the output signal from the threshold differencer (754).

This embodiment provides a means for threshold tracking and feedback, the output from the threshold differencer (754) being employed to adjust the mark-space ratio of the data-out signal output from the amplifier (10).

Figure 20:
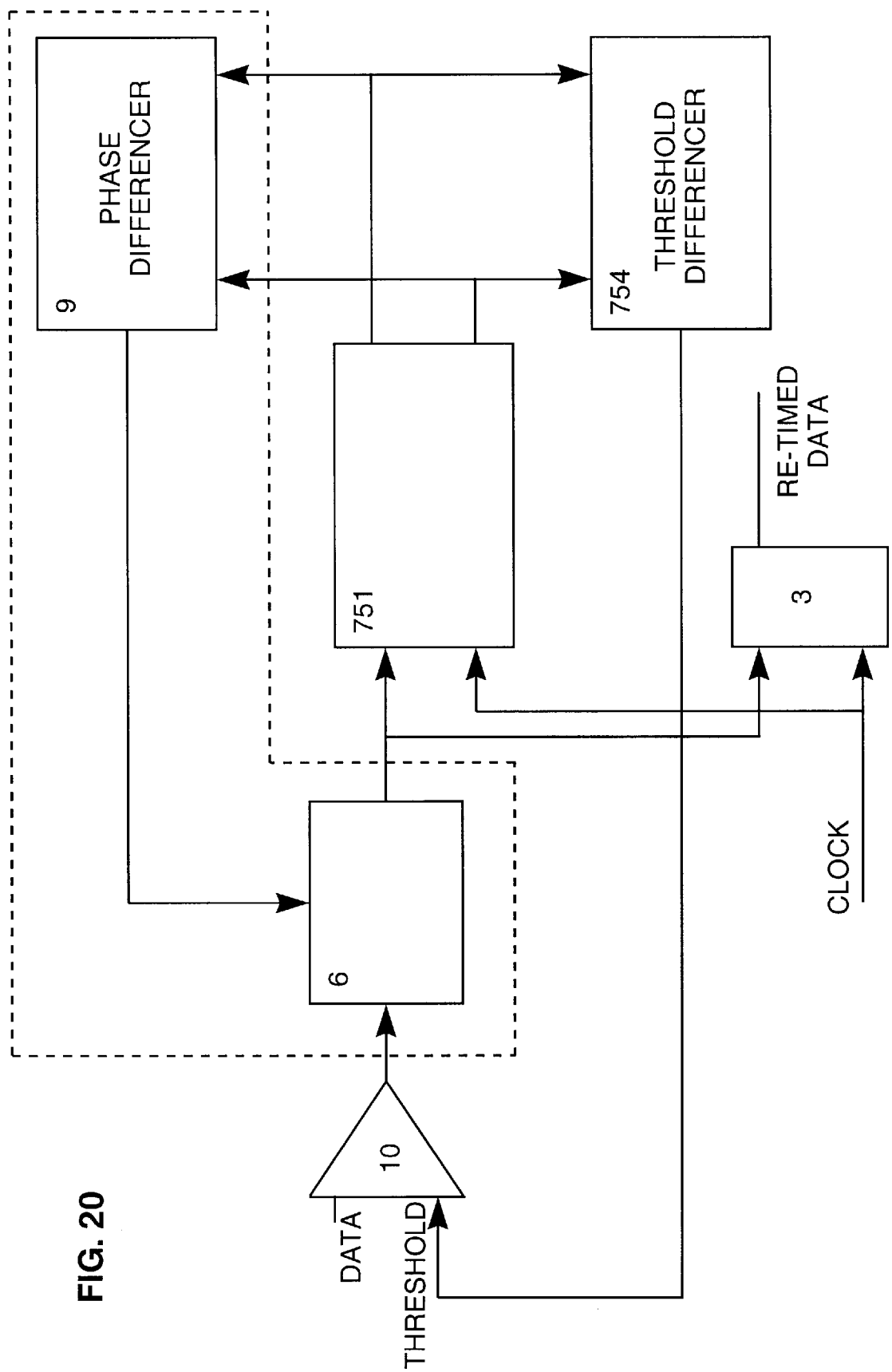
FIG. 20 shows a block diagram of a combined threshold and phase tracking system in accordance with the present invention.

A block circuit diagram for a fourth embodiment of a threshold detector in accordance with the present invention is shown in FIG. 20. This first embodiment comprises: a rising/falling phase detector (1), a threshold differencer (754), an amplifier (10), a phase differencer (9), an adjustable delay (6), and a re-timing circuit (3).

This embodiment differs from the third embodiment in that the phase differencer (9), the adjustable delay (6), and the re-timing circuit (3) are added.

The phase differencer (9) takes as inputs the output phase difference signals from the rising/falling phase detector (751).

The adjustable delay (6) is located between the amplifier (10) and the rising/falling phase detector (751), taking both the output signal from the amplifier (10) and the output signal from the phase differencer (9) as its. The rising/falling phase detector (751) takes the output from the adjustable delay (6) as input on its data line.

The re-timing circuit (3) takes as inputs the delayed data signal output from the adjustable delay (6) and the clock signal, and outputs a re-timed data signal.

The phase difference signal output from the phase differencer (9) is utilised to provide feedback to the adjustable delay (6) so as to vary the phase difference between the signal received on the data line of the rising/falling phase detector and the clock signal.

In this embodiment, common use is made of a rising/falling phase detector to derive signals both for threshold difference and for phase difference, thereby minimising the overall circuitry required.

Further embodiments of the present invention may be derived by locating the adjustable delay (6) in the clock signal path rather than in the data signal path or by locating an adjustable delay in both of those paths separately or by means of adjusting the clock signal by other means (for example, by means of a voltage controlled oscillator), together with appropriately modified circuitry providing feedback from the rising/falling phase detector.

Other variations within the scope of the following claims will be apparent to a skilled person.

I claim:

1. A digital signal threshold error detector comprising:
    rising/falling edge phase detector circuit means adapted to provide a first and a second phase output signals responsive to receipt of rising and falling edges respectively in a data input signal relative to a clock signal; and
    threshold circuit means adapted to provide a threshold difference signal which varies linearly with the threshold error of the data signal in response to receipt of the phase output signals.

2. A digital signal threshold error detector as claimed in claim 1,
    wherein the threshold circuit means is adapted to provide threshold difference signal, the moving time average of which varies linearly with the threshold error of the data signal.

3. A digital signal threshold error detector as claimed in claim 1 additionally comprising:
    phase difference consolidating circuit means adapted to provide a phase difference signal, the moving time average of which varies linearly with the phase error of the data signal, in response to receipt of the phase output signals.

4. A digital signal threshold error detector as claimed in claim 1 additionally comprising:
    phase difference consolidating circuit means adapted to provide a phase difference signal, the moving time average of which varies linearly with the phase error of the data signal, in response to receipt of the phase output signals,
    and wherein the threshold circuit means is adapted to provide threshold difference signal, the moving time average of which varies linearly with the threshold error of the data signal.

5. A digital signal threshold error detector as claimed in claim 1 additionally comprising:
    amplifier circuit means adapted to provide the data input signal to the rising/falling edge phase detector circuit in response to a second data input signal and the threshold difference signal.

6. A digital signal threshold error detector as claimed in claim 1 additionally comprising:
    amplifier circuit means adapted to provide the data input signal to the rising/falling edge phase detector circuit in response to a second data input signal and the threshold difference signal;
    adjustable delay circuit means adapted to adjust the phase difference between the clock signal and the data input signal received by the rising/falling phase detector circuit, in response to receipt of one or more output signals from the rising/falling edge phase detector,
    retiming circuit means adapted to provide a retimed data signal in response to receipt of the clock signal and the data input signal received by rising/falling edge phase detector.

7. A digital signal threshold detector as claimed in claim 1 additionally comprising:
    means for controlling a threshold in response to the threshold difference signal.

8. A method for digital signal threshold error detection comprising the steps of:
    providing a first and a second phase output signals responsive to receipt of rising and falling edges respectively in a data input signal relative to a clock signal; and
    providing a threshold difference signal which varies linearly with the threshold error of the data signal in response to receipt of the phase output signals.

* * * * *